(12) United States Patent
Dejima

(10) Patent No.: US 7,763,490 B2
(45) Date of Patent: Jul. 27, 2010

(54) THIN FILM TRANSISTOR SUBSTRATE AND METHOD FOR FABRICATING THE SAME

(75) Inventor: Yoshio Dejima, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/825,973

(22) Filed: Jul. 10, 2007

(65) Prior Publication Data

US 2007/0257262 A1    Nov. 8, 2007

Related U.S. Application Data

(62) Division of application No. 10/795,787, filed on Mar. 8, 2004, now Pat. No. 7,259,045.

(30) Foreign Application Priority Data

Mar. 14, 2003    (JP) .............................. 2003-070504

(51) Int. Cl.
  H01L 29/04      (2006.01)
  H01L 31/0376    (2006.01)
  H01L 31/20      (2006.01)
  H01L 31/036     (2006.01)

(52) U.S. Cl. .................. 438/57; 257/59; 257/E29.117; 257/E29.137; 438/149; 438/161

(58) Field of Classification Search .................. None
  See application file for complete search history.

(56) References Cited

U.S. PATENT DOCUMENTS 6,468,840 B2    10/2002    Tanaka et al.
6,902,852 B2    6/2005     Watanabe
2001/0048491 A1  12/2001    Tanaka et al.
2002/0085161 A1  7/2002     Yoo et al.
2002/0159010 A1  10/2002    Maeda et al.
2005/0117082 A1  6/2005     Tanaka et al.

FOREIGN PATENT DOCUMENTS

| JP | 64-10222       | 1/1989  |
| JP | 02000012541 A  | 1/2000  |
| JP | 2001-311965    | 11/2001 |
| JP | 2002-55363     | 2/2002  |
| JP | 02002184999 A  | 6/2002  |
| JP | 2002-328396    | 11/2002 |

Primary Examiner—Zandra Smith
Assistant Examiner—Khanh B Duong
(74) Attorney, Agent, or Firm—Greer, Burns & Crain, Ltd.

(57) ABSTRACT

A stagger type thin film transistor substrate in which each of a source and a drain of a thin film transistor has a laminated structure including a silicon semiconductor layer, a silicon semiconductor layer containing impurities, and a metal layer formed in that order and in which a gate insulator of the thin film transistor is formed on the source and the drain. A pixel electrode is connected to the source via a contact hole made in the gate insulator on the source. Additionally, a gate electrode of the thin film transistor formed on the gate insulator has a laminated structure including two layers of different electrode materials. Finally, the pixel electrode connected to the source is made of an electrode material used in a lower layer of the gate electrode.

2 Claims, 49 Drawing Sheets

US 7,763,490 B2

THIN FILM TRANSISTOR SUBSTRATE AND METHOD FOR FABRICATING THE SAME

This is a divisional of application Ser. No. 10/795,787, filed Mar. 8, 2004 now U.S. Pat. No. 7,259,045.

CROSS-REFERENCE TO RELATED APPLICATIONS

This application is based upon and claims the benefits of priority from the prior Japanese Patent Application No. 2003-070504, filed on Mar. 14, 2003, the entire contents of which are incorporated herein by reference.

BACKGROUND OF THE INVENTION (1) Field of the Invention

This invention relates to a thin film transistor (TFT) substrate and a method for fabricating such a TFT substrate and, more particularly, to a stagger type TFT substrate fabricated through a plurality of exposure processes using a plurality of kinds of masks and a method for fabricating such a stagger type TFT substrate.

(2) Description of the Related Art

In recent years improvement in the performance of liquid crystal display units has been required greatly to obtain high brilliance, high intensity and high definition. In particular, the study and development of TFT substrates included in liquid crystal panels used in them are proceeding. In addition, today liquid crystal display units must be manufactured by efficient, more simplified processes from the viewpoint of corporate profits. Furthermore, consideration must be given to the environment on the earth in utilizing electric power and raw materials in these manufacturing processes.

Currently, TFT substrates are manufactured mainly by a reverse stagger system. TFT substrates are formed through a plurality of exposure processes by the use of a plurality of masks. In this case, at least five masks are used for forming a gate bus-line layer, an operation island layer, a drain bus-line layer, a protection film layer, and a pixel electrode layer on TFT substrates. That is to say, to manufacture reverse-stagger type TFT substrates, as many as five exposure processes must be performed. Therefore, to improve efficiency in the manufacture of such reverse-stagger type TFT substrates, a method, for example, for reducing the number of the exposure processes from five to three by the use of a half tone mask is proposed (see, for example, Japanese Unexamined Patent Publication No. 2001-311965).

By the way, there is another system, which is called a stagger system, for manufacturing TFT substrates. By adopting this system, TFT substrates which differ from reverse-stagger type TFT substrates in structure can be formed. Compared with reverse-stagger type TFT substrates, stagger type TFT substrates have, for example, the following advantages. Layers included in stagger type TFT substrates can be formed continuously. In addition, an interface treatment process is not necessary for manufacturing stagger type TFT substrates.

Conventionally, however, a plurality of exposure processes must be performed with five to eight masks to manufacture stagger type TFT substrates. Accordingly, manufacturing efficiency is low and it takes many a day to complete TFT substrates. Moreover, many (kinds of) masks are used and a plurality of exposure processes are performed. This increases the probability that a display defect will occur due to, for example, dust. As stated above, problems, such as manufacturing efficiency, a yield, and manufacturing costs, which will arise at the time of manufacturing stagger type TFT substrates remain unresolved.

SUMMARY OF THE INVENTION

The present invention was made under the background circumstances described above. An object of the present invention is to provide a high-quality stagger type TFT substrate and a high-productivity manufacturing method therefor in which the number of exposure processes is reduced.

In order to achieve the above object, a method for fabricating a stagger type thin film transistor substrate is provided. This method for fabricating a stagger type thin film transistor substrate includes the process of forming a resist pattern with different thicknesses in different areas by performing exposure once on a resist with a half tone mask.

Furthermore, in order to achieve the above object, a stagger type thin film transistor substrate is provided. In this stagger type thin film transistor substrate, each of a source and a drain of a thin film transistor has a laminated structure including a silicon semiconductor layer, a silicon semiconductor layer containing impurities, and a metal layer formed in that order and a gate insulator of the thin film transistor is formed on the source and the drain.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

A first embodiment of the present invention will be described first.

Figure 1:
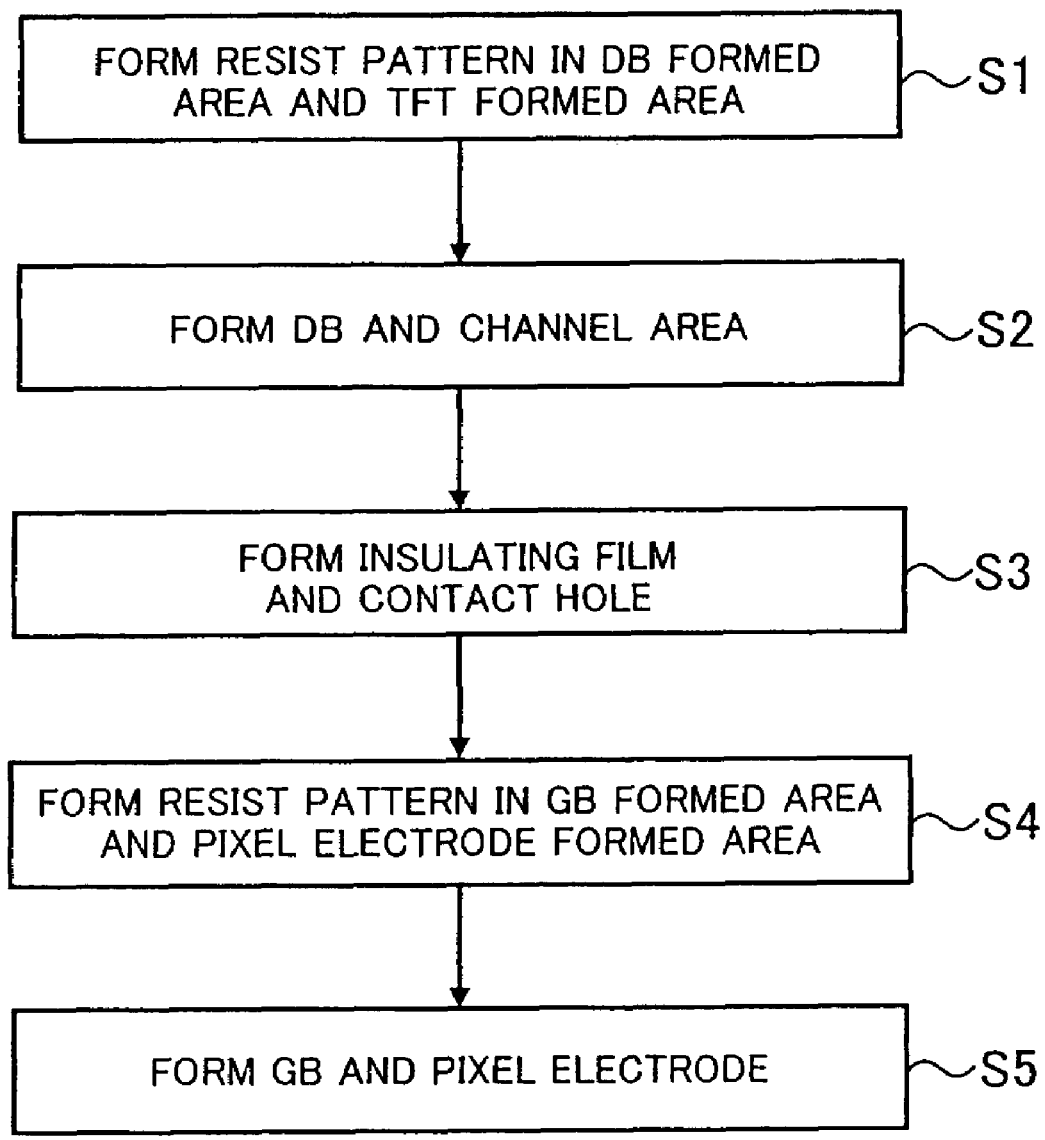
FIG. 1 shows the flow of a method for manufacturing a stagger type TFT substrate according to a first embodiment of the present invention.

FIG. 1 shows the flow of a method for manufacturing a stagger type TFT substrate according to the first embodiment of the present invention. FIGS. 2 through 21 are views for describing individual manufacturing processes. The method for fabricating a stagger type TFT substrate according to the first embodiment of the present invention is broadly divided into five steps S1 through S5 shown in FIG. 1. These steps will now be described with reference to FIGS. 2 through 21.

Figure 2:
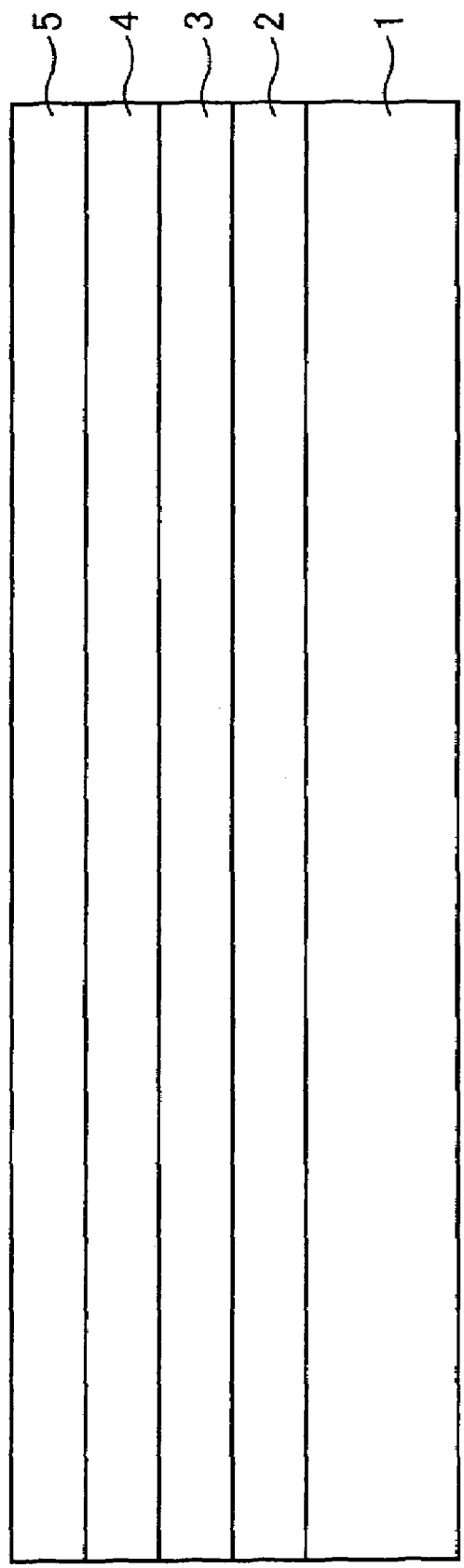
FIG. 2 is a cross-sectional view showing the feature of a continuous film formation process.
Figure 3:
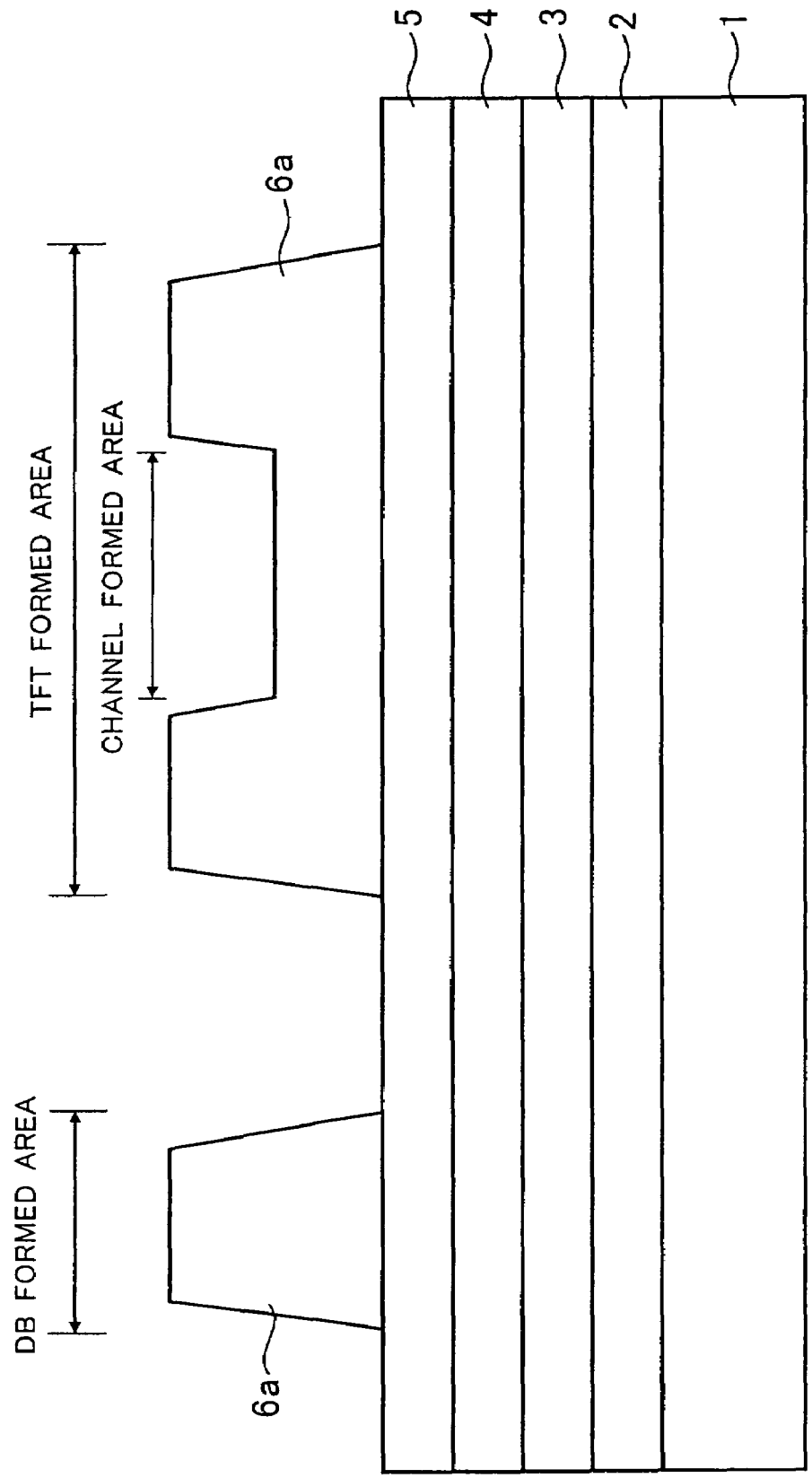
FIG. 3 is a cross-sectional view showing the feature of a first exposure process.

Step S1 will be described first. FIG. 2 is a cross-sectional view showing the feature of a continuous film formation process. FIG. 3 is a cross-sectional view showing the feature of a first exposure process.

As shown in FIG. 2, to manufacture a stagger type TFT substrate, a foundation insulating film layer 2, an operation layer 3, an active layer 4, and a drain bus-line (DB) layer 5 are continuously formed first on a glass substrate 1 of, for example, transparent no-alkali glass. The foundation insulating film layer 2, the operation layer 3, the active layer 4, and the DB layer 5 are continuously formed in one chamber of, for example, a chemical vapor deposition (CVD) system. The foundation insulating film layer 2 is formed by the use of $Si_3N_4$, SiO, SiON, or the like so that it will have a thickness of about 50 to 200 nm. Each of the operation layer 3 and the active layer 4 is formed by the use of amorphous silicon (a-Si) so that it will have a thickness of about 10 to 300 nm. After that, to make the active layer 4 an $n^+$ layer, it is treated with phosphine or the like. Later a gate insulator of a TFT is to be formed on the TFT substrate with, for example, a plasma CVD (P-CVD) system. In this case, a temperature at which the gate insulator is to be formed is higher than a temperature at which the operation layer 3, for example, is formed. Accordingly, the DB layer 5 is formed by the use of a refractory metal (or alloy), such as Cr, Mo, or Ti. The thickness of the DB layer 5 is about 100 to 300 nm. The DB layer 5 may be formed by sputtering.

As shown in FIG. 3, then first exposure is performed on a photoresist 6a formed on the DB layer 5 with a half tone mask to form a resist pattern. This resist pattern masks an area (DB formed area) on the TFT substrate where a DB is to be formed and an area (TFT formed area) on the TFT substrate where the TFT is to be formed. Moreover, as a result of the exposure with the half tone mask in this first exposure process, the photoresist 6a on an area (channel formed area) in the TFT formed area where a channel for the TFT is to be formed becomes thinner than the photoresist 6a on an area in the TFT formed area other than the channel formed area. The half tone mask may include a semi-transmission film or be perforated.

Figure 4:
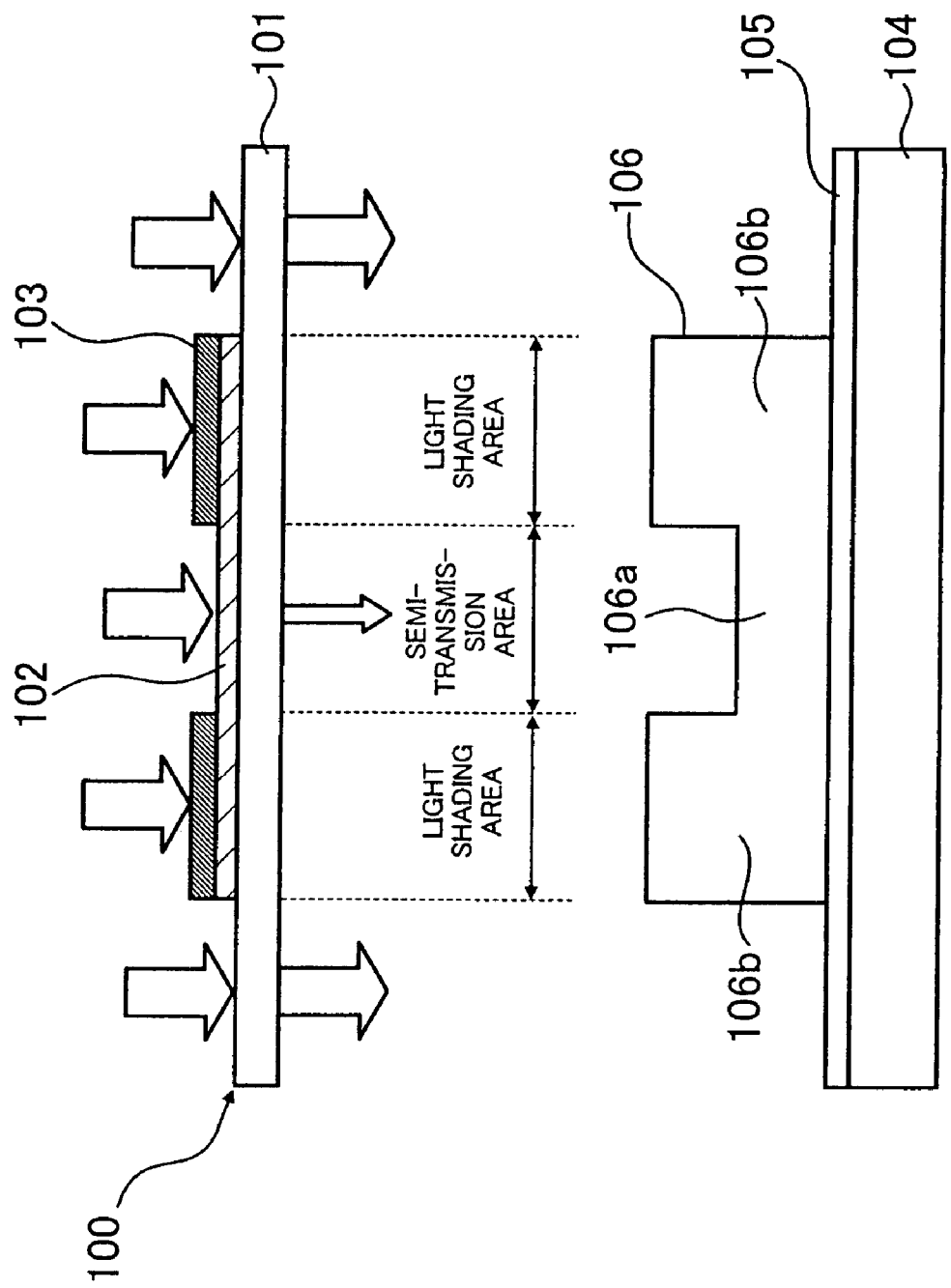
FIG. 4 is a view for describing a half tone mask including a semi-transmission film.
Figure 5:
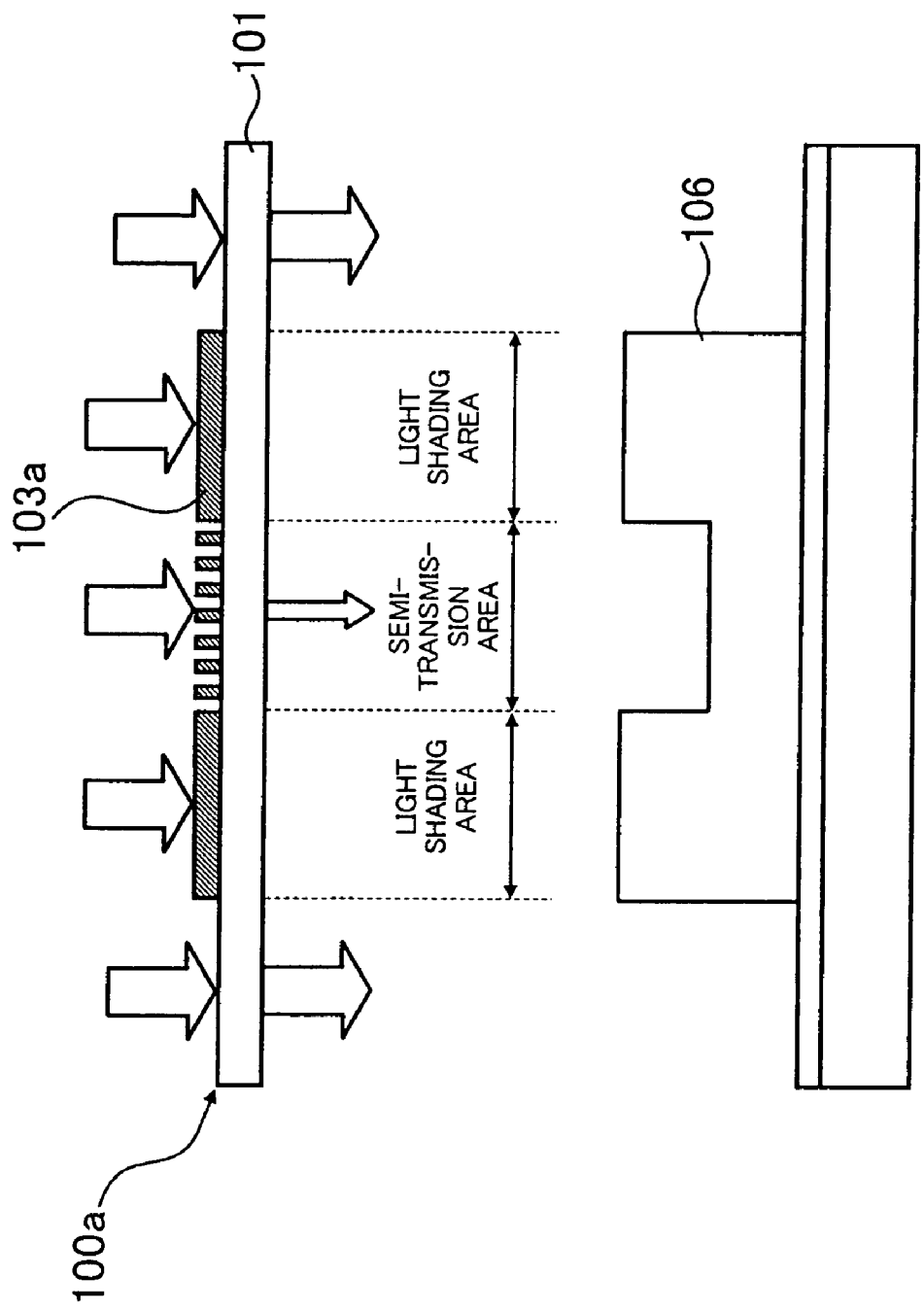
FIG. 5 is a view for describing a perforated half tone mask.

The half tone mask will now be described. FIG. 4 is a view for describing a half tone mask including a semi-transmission film. FIG. 5 is a view for describing a perforated half tone mask. Components in FIG. 5 which are the same as those shown in FIG. 4 are designated by identical reference numerals and detailed descriptions of them will be omitted.

With a half tone mask 100 including a semi-transmission film shown in FIG. 4, a semi-transmission film 102 which transmits incident light in some degree is formed on a silica plate 101, being a mask substrate. A light shading film 103 which shades the incident light is formed on part of the semi-transmission film 102. A chromium-based material (CrON), a molybdenum-based material (MoSiON), a tungsten-based material (WSiON), a silicon-based material (SiN), or the like is used for forming the semi-transmission film 102. A metallic material, such as Cr, is used for forming the light shading film 103. Each of the semi-transmission film 102 and the light shading film 103 on the silica plate 101 forms an appropriate pattern and has appropriate thickness. An area where only the semi-transmission film 102 is formed on the silica plate 101 is a semi-transmission area for incident light. An area where both the semi-transmission film 102 and the light shading film 103 are formed on the silica plate 101 is a light shading area for the incident light. By exposing a photoresist 106 formed on a film 105 to be etched on a glass substrate 104 by the use of the half tone mask 100, the thickness of a photoresist 106a in the semi-transmission area becomes thinner than that of a photoresist 106b in the light shading area.

With a perforated half tone mask 100a shown in FIG. 5, a light shading film 103a in which slits are made is formed on a silica plate 101. An area where the slits are made is a semi-transmission area for incident light. By exposing a photoresist 106 by the use of the perforated half tone mask 100a, a resist pattern with different thicknesses can be formed. This is the same with the half tone mask 100 including a semi-transmission film.

When a half tone mask like the one shown in FIG. 4 or 5 is used, a resist pattern with different thicknesses in different areas can be formed by performing exposure once. In addition, by changing, for example, the thickness of or a material for the semi-transmission film, a resist pattern with two or more different thicknesses can be formed.

Figure 6:
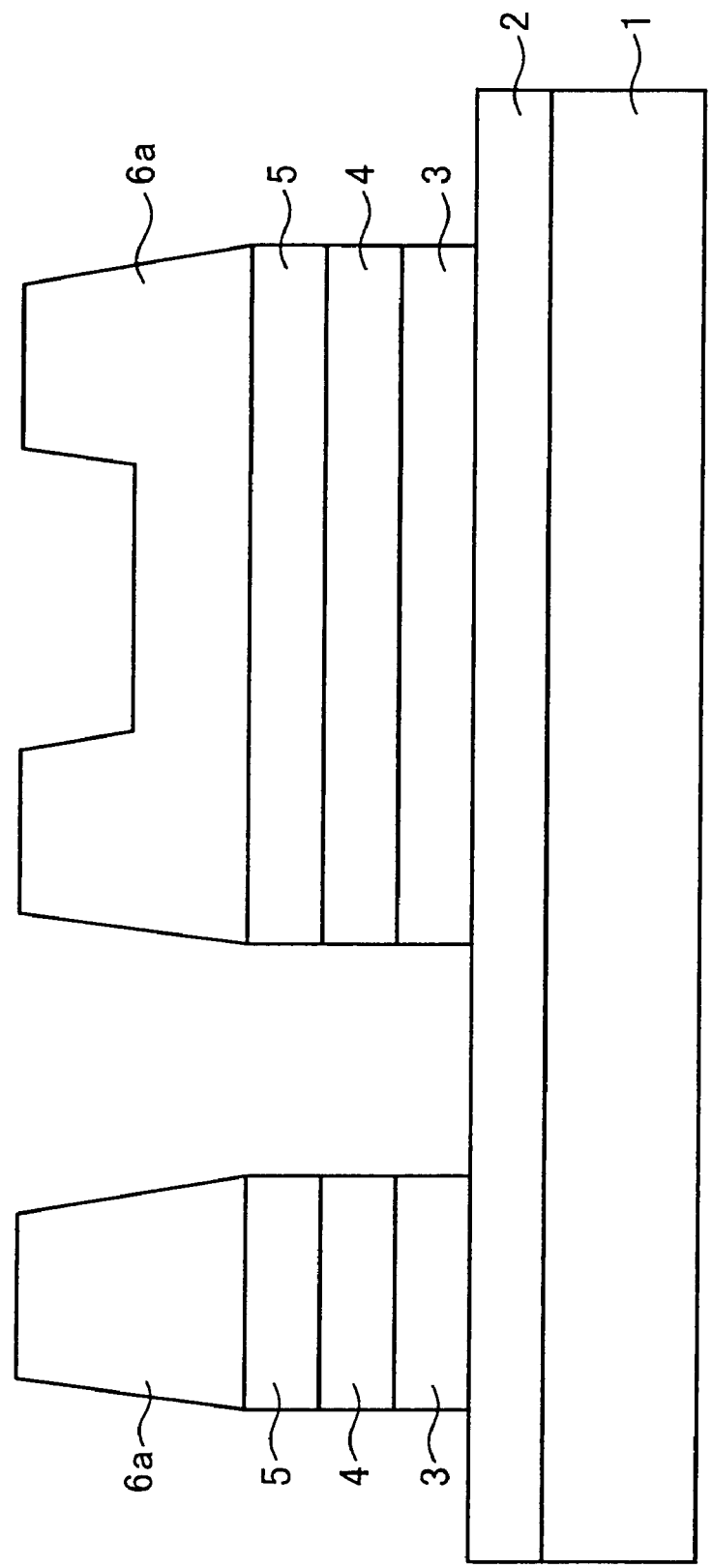
FIG. 6 is a cross-sectional view showing the feature of an etching process performed after the first exposure process.

As shown in FIG. 3, the first exposure is performed on the photoresist 6a with such a half tone mask to form the resist pattern in the DB formed area and the TFT formed area. The thicknesses of the resist pattern correspond to these areas. FIG. 6 is a cross-sectional view showing the feature of an etching process performed after the first exposure process. As shown in FIG. 6, wet etching or dry etching is performed on the DB layer 5, the active layer 4, and the operation layer 3 with the resist pattern formed in the first exposure process as a mask.

Figure 7:
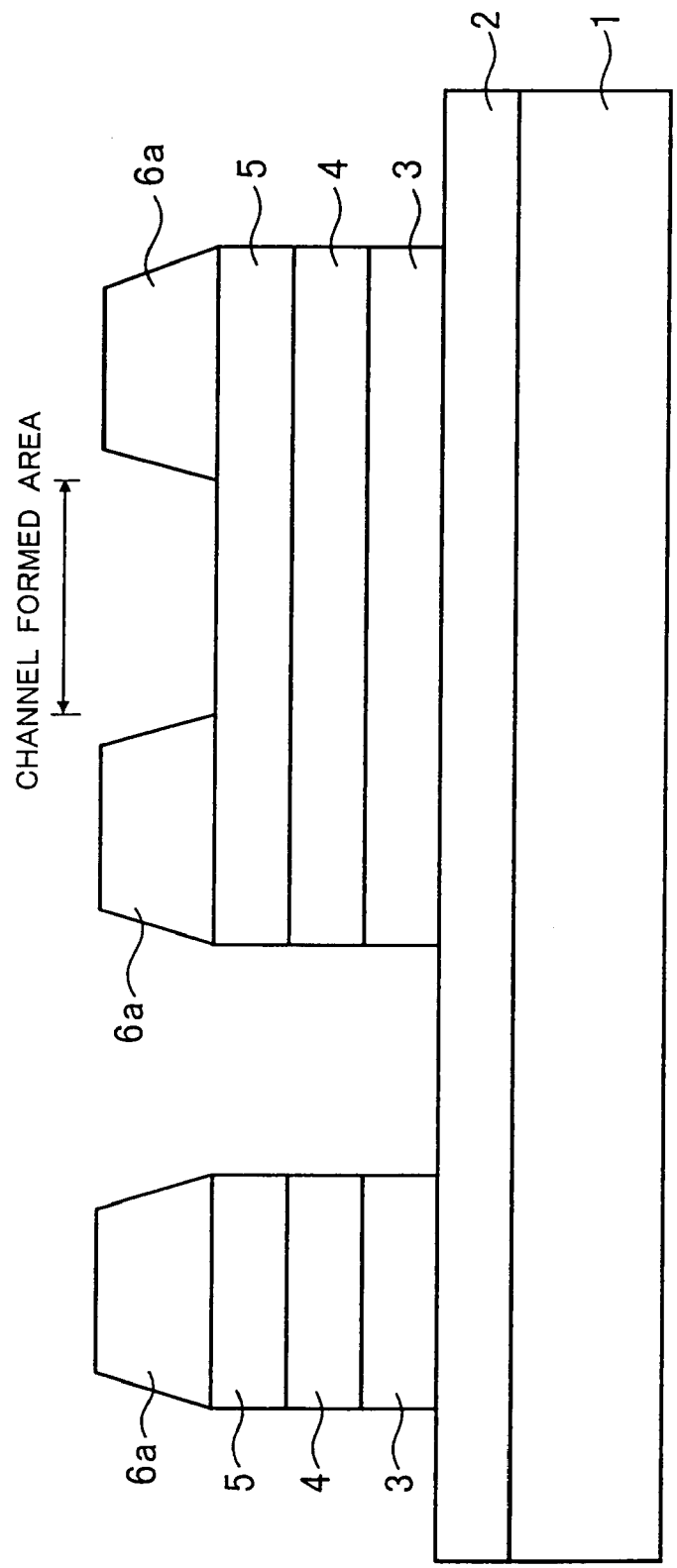
FIG. 7 is a cross-sectional view showing the feature of a first ashing process.
Figure 8:
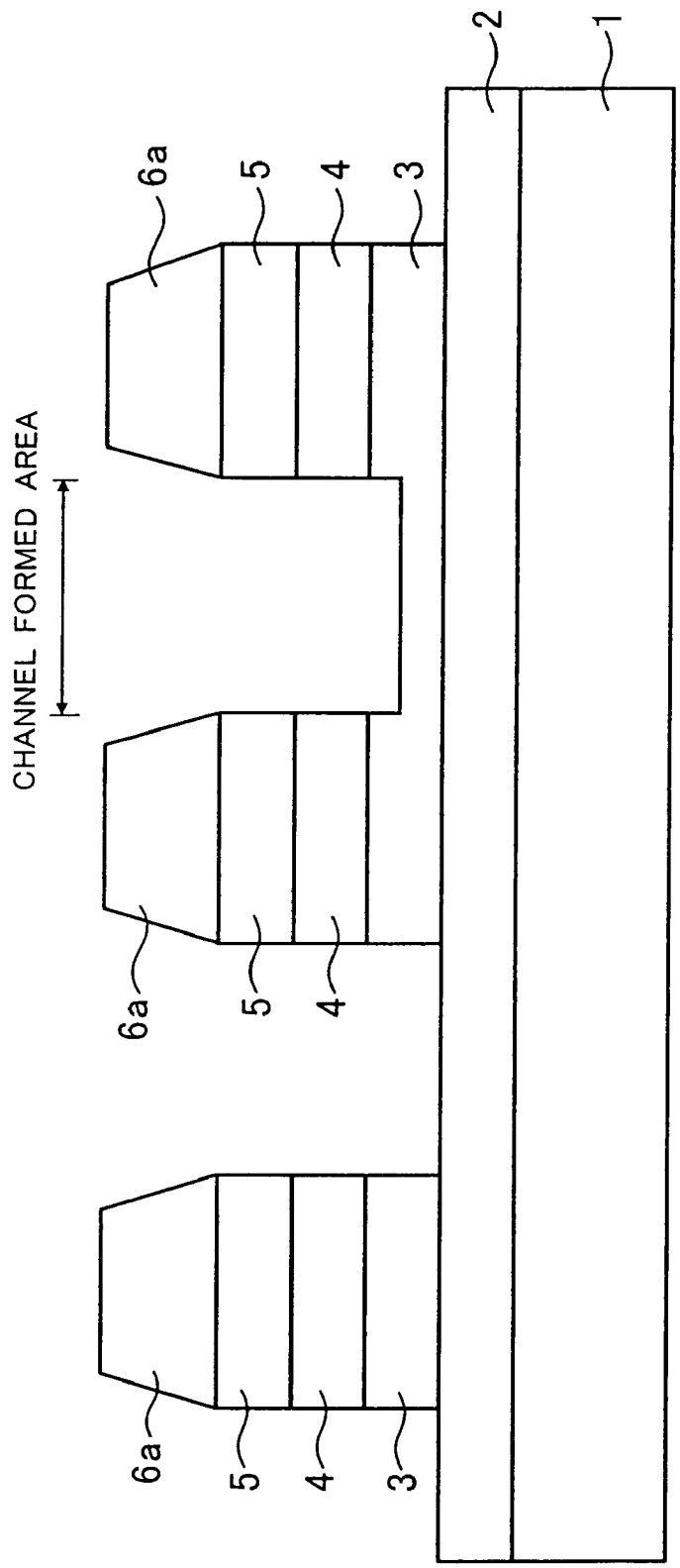
FIG. 8 is a cross-sectional view showing the feature of a channel etching process.
Figure 9:
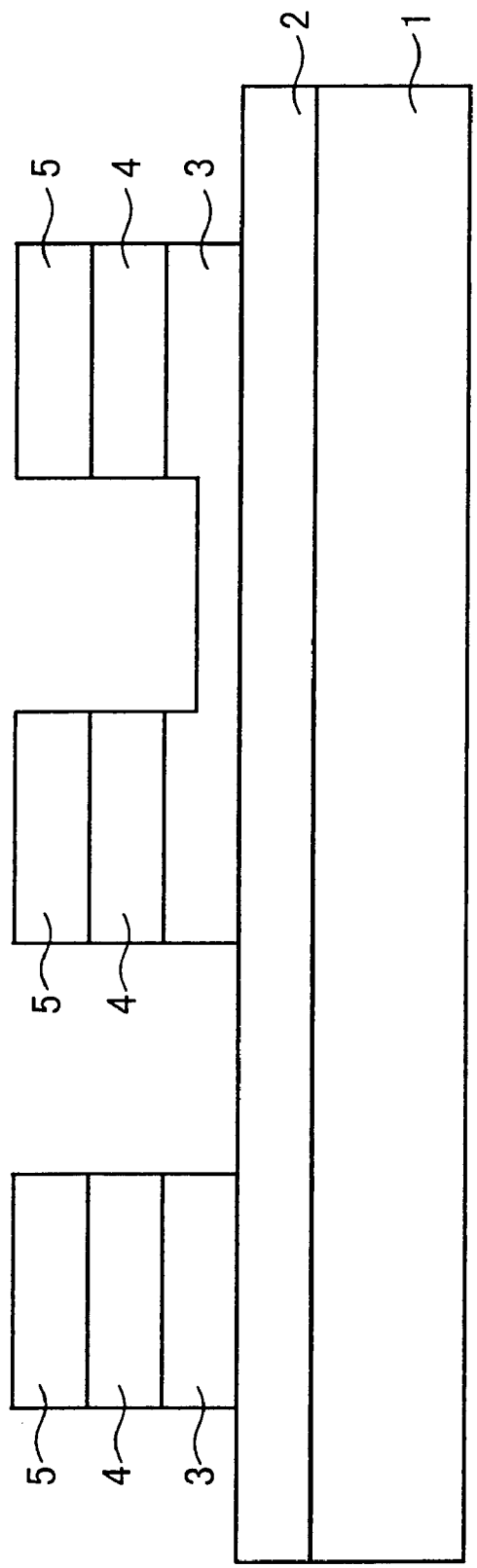
FIG. 9 is a cross-sectional view showing the feature of a resist stripping process performed after the channel etching process.
Figure 10:
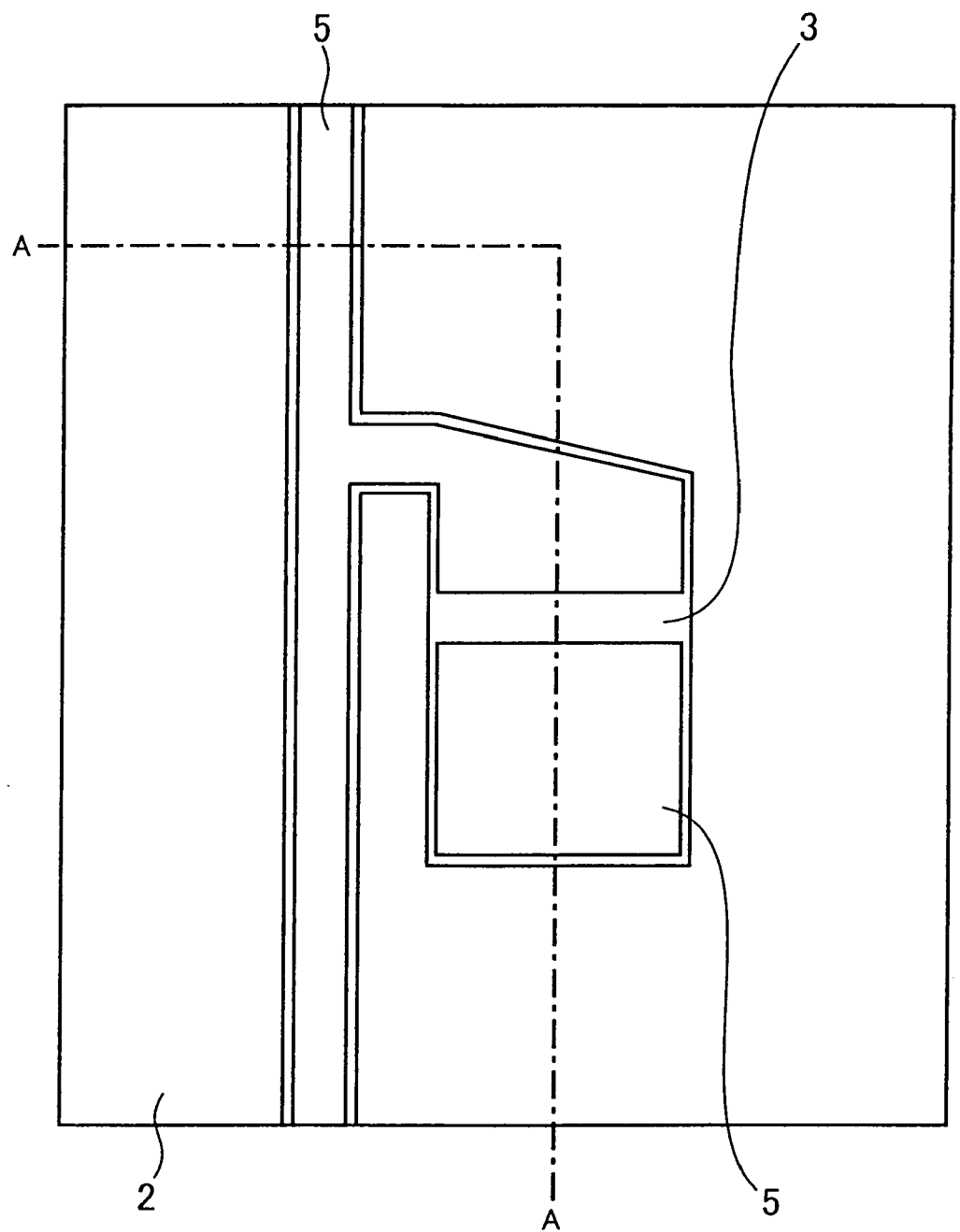
FIG. 10 is a plan view showing the feature of the basic structure of a TFT substrate in the resist stripping process performed after the channel etching process.

Step S2 will now be described. When the etching process to be performed after the first exposure process is completed, resist pattern ashing, channel etching, and resist stripping are performed in step S2. FIG. 7 is a cross-sectional view showing the feature of a first ashing process. FIG. 8 is a cross-sectional view showing the feature of a channel etching process. FIG. 9 is a cross-sectional view showing the feature of a resist stripping process performed after the channel etching process. FIG. 10 is a plan view showing the feature of the basic structure of a TFT substrate in the resist stripping process performed after the channel etching process. FIG. 9 is a cross-sectional view taken along lines A-A of FIG. 10. For convenience, the operation layer 3 under the DB layer 5 is also shown in FIG. 10.

After the etching of the DB layer 5, the active layer 4, and the operation layer 3 shown in FIG. 6, ashing is performed on the resist pattern of the photoresist 6a with $O_2$. As shown in FIG. 7, the photoresist 6a on the DB layer 5 in the channel formed area is removed to expose the DB layer 5. As shown in FIG. 8, the DB layer 5 and the active layer 4 in the channel formed area are wet- or dry-etched with the remaining photoresist 6a as a mask. When the operation layer 3 in the channel formed area is wet- or dry-etched (channel etching), it should not be etched off. As a result, a channel area for the TFT will be formed. This channel etching is performed so that the thickness of the operation layer 3 to be a channel area will be most suitable for the TFT to be formed on the TFT substrate. After the channel etching, the photoresist 6a is stripped. As a result, the basic structure of the TFT substrate shown in FIGS. 9 and 10 will be formed.

Figure 11:
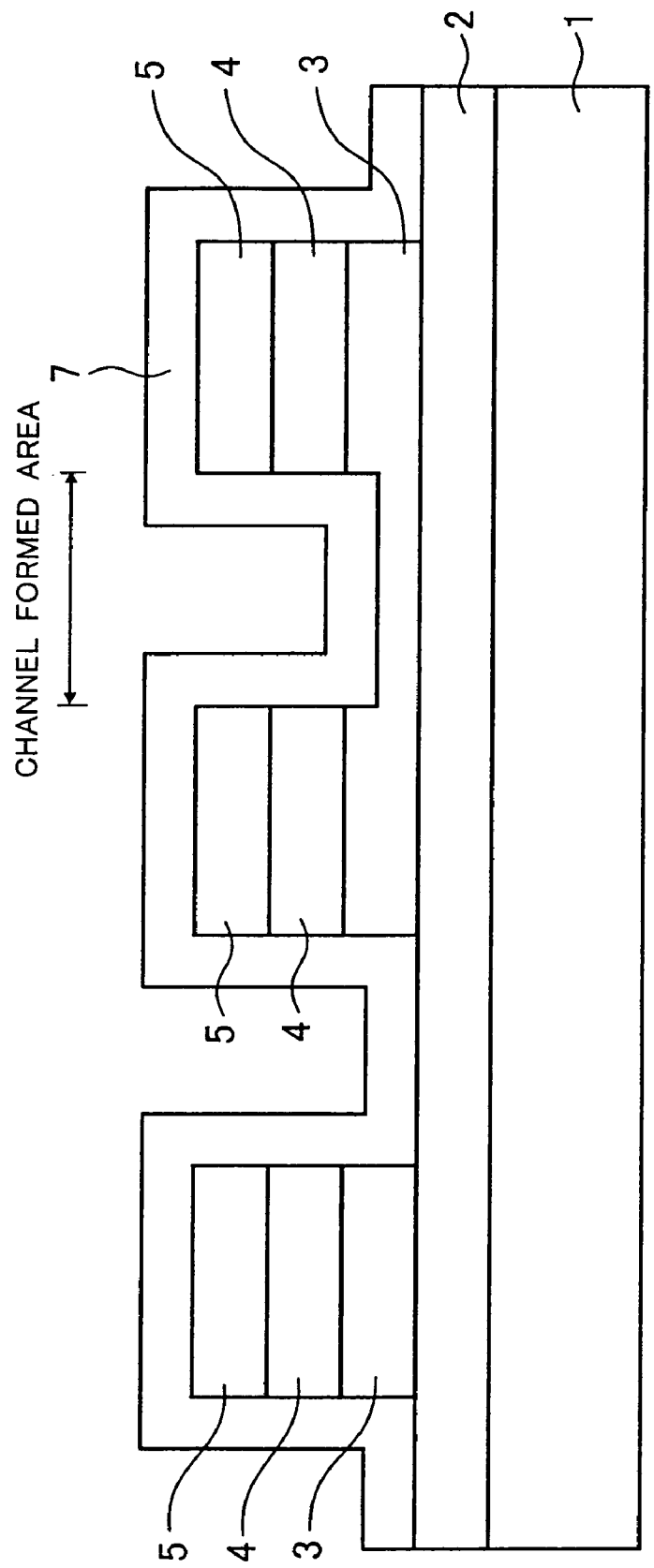
FIG. 11 is a cross-sectional view showing the feature of an insulating film formation process.
Figure 12:
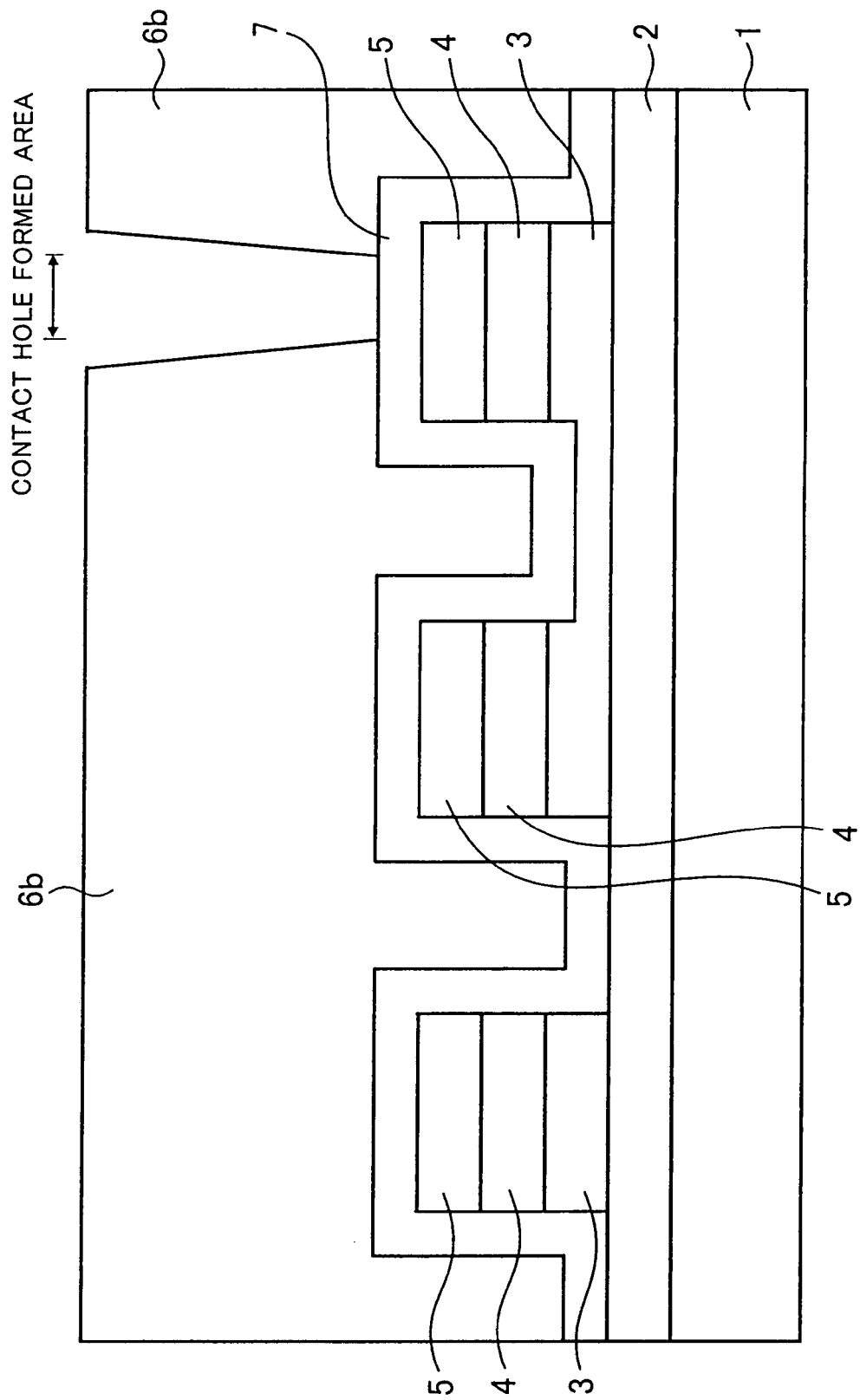
FIG. 12 is a cross-sectional view showing the feature of a second exposure process.
Figure 13:
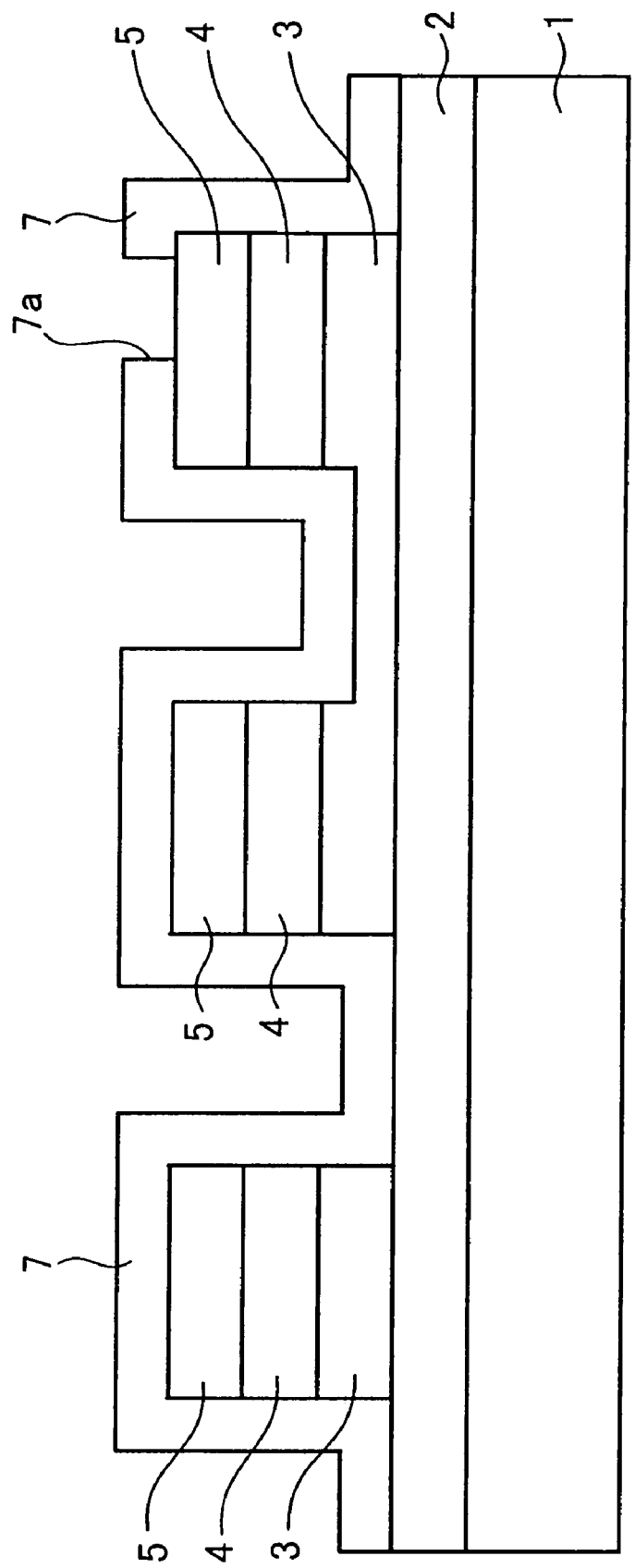
FIG. 13 is a cross-sectional view showing the feature of an insulating film etching process.
Figure 14:
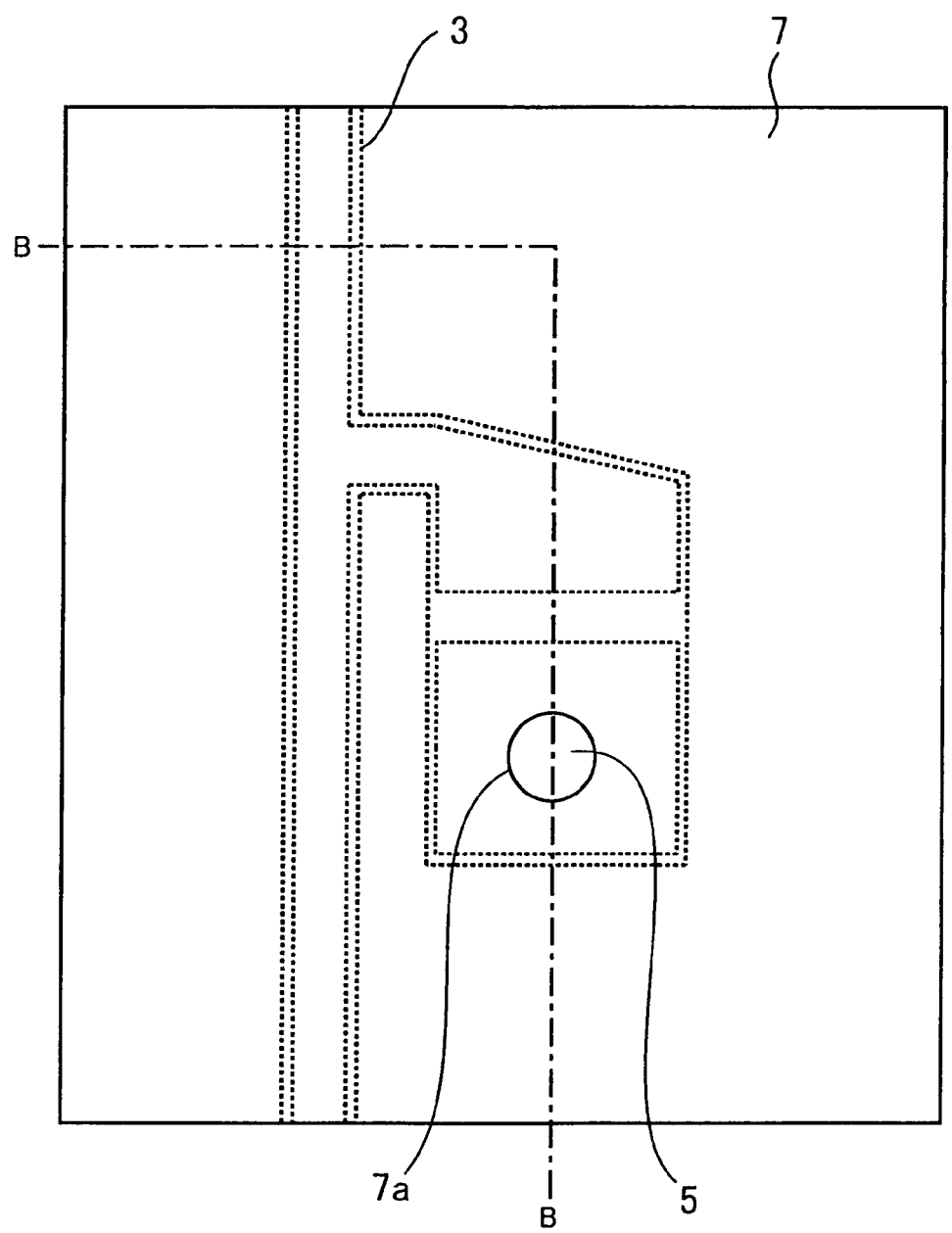
FIG. 14 is a plan view showing the feature of the basic structure of the TFT substrate in the insulating film etching process.
Figure 15:
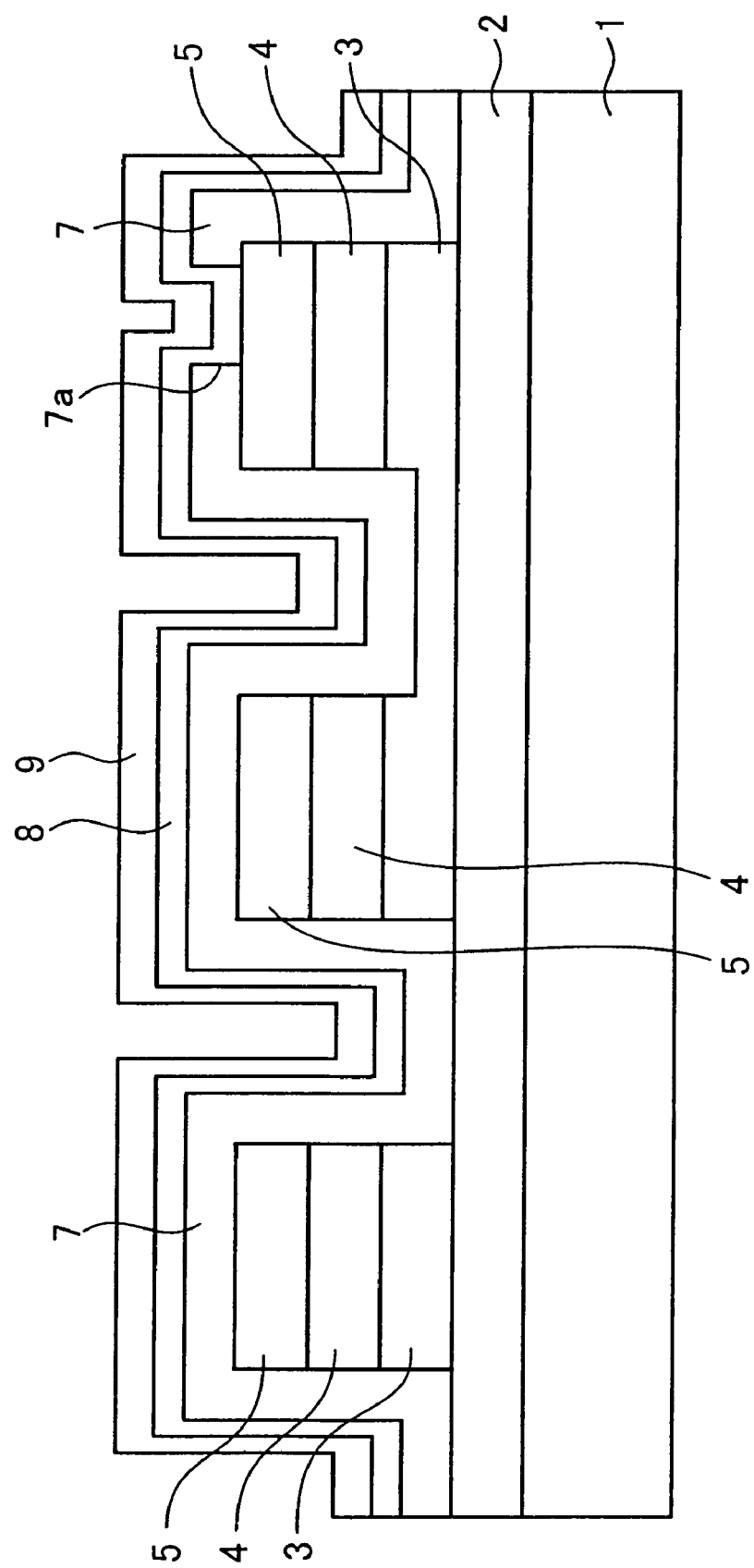
FIG. 15 is a cross-sectional view showing the feature of a transparent conductive film layer and GB layer formation process.

Step S3 will now be described. FIG. 11 is a cross-sectional view showing the feature of an insulating film formation process. FIG. 12 is a cross-sectional view showing the feature of a second exposure process. FIG. 13 is a cross-sectional view showing the feature of an insulating film etching process. FIG. 14 is a plan view showing the feature of the basic structure of the TFT substrate in the insulating film etching process. FIG. 15 is a cross-sectional view showing the feature of a transparent conductive film layer and GB layer formation process. FIG. 13 is a cross-sectional view taken along lines B-B of FIG. 14. For convenience, the operation layer 3 under the DB layer 5 is also shown in FIG. 14.

After the basic structure of the TFT substrate shown in FIGS. 9 and 10 is formed, an insulating film 7 is formed on the entire surface with the P-CVD system as shown in FIG. 11. $Si_3N_4$, SiO, SiON, or the like can be used for forming the insulating film 7. A portion of the insulating film 7 formed in the channel formed area will function as the gate insulator of the TFT to be completed later, so the insulating film 7 is formed as a fine film with the P-CVD system at a high temperature of about 250 to 300° C. The thickness of the insulating film 7 is properly set to a value between about 100 and 500 nm according to materials and characteristics requisite for the TFT to be formed.

As shown in FIG. 12, after the insulating film 7 is formed, a photoresist 6b is formed on the insulating film 7 and second exposure is performed. By doing so, a resist pattern in which a taper opening is made over an area (contact hole formed area) in the insulating film 7 where a contact hole is to be made is formed. After the second exposure process, the insulating film 7 is wet- or dry-etched with the resist pattern as a mask. Then the photoresist 6b is stripped. As a result, as shown in FIGS. 13 and 14, the basic structure of the TFT substrate is formed. The top layer is covered with the insulating film 7 and a contact hole 7a is made in the insulating film 7. The DB layer 5 gets exposed at the bottom of the contact hole 7a.

After the photoresist 6b is stripped, a transparent conductive film layer 8 and a GB layer 9 are formed on the entire surface in that order as shown in FIG. 15. The transparent conductive film layer 8 of, for example, indium tin oxide (ITO) is about 30 to 100 nm in thickness and is formed by CVD or sputtering. Cr, Mo, Ti, Al, or the like can be used for forming the GB layer 9 with stability and low resistance taken into consideration. The GB layer 9 is about 100 to 300 nm in thickness and is formed by CVD or sputtering. As a result, the transparent conductive film layer 8 will come into direct contact with the DB layer 5 which is exposed in the contact hole 7a.

Figure 16:
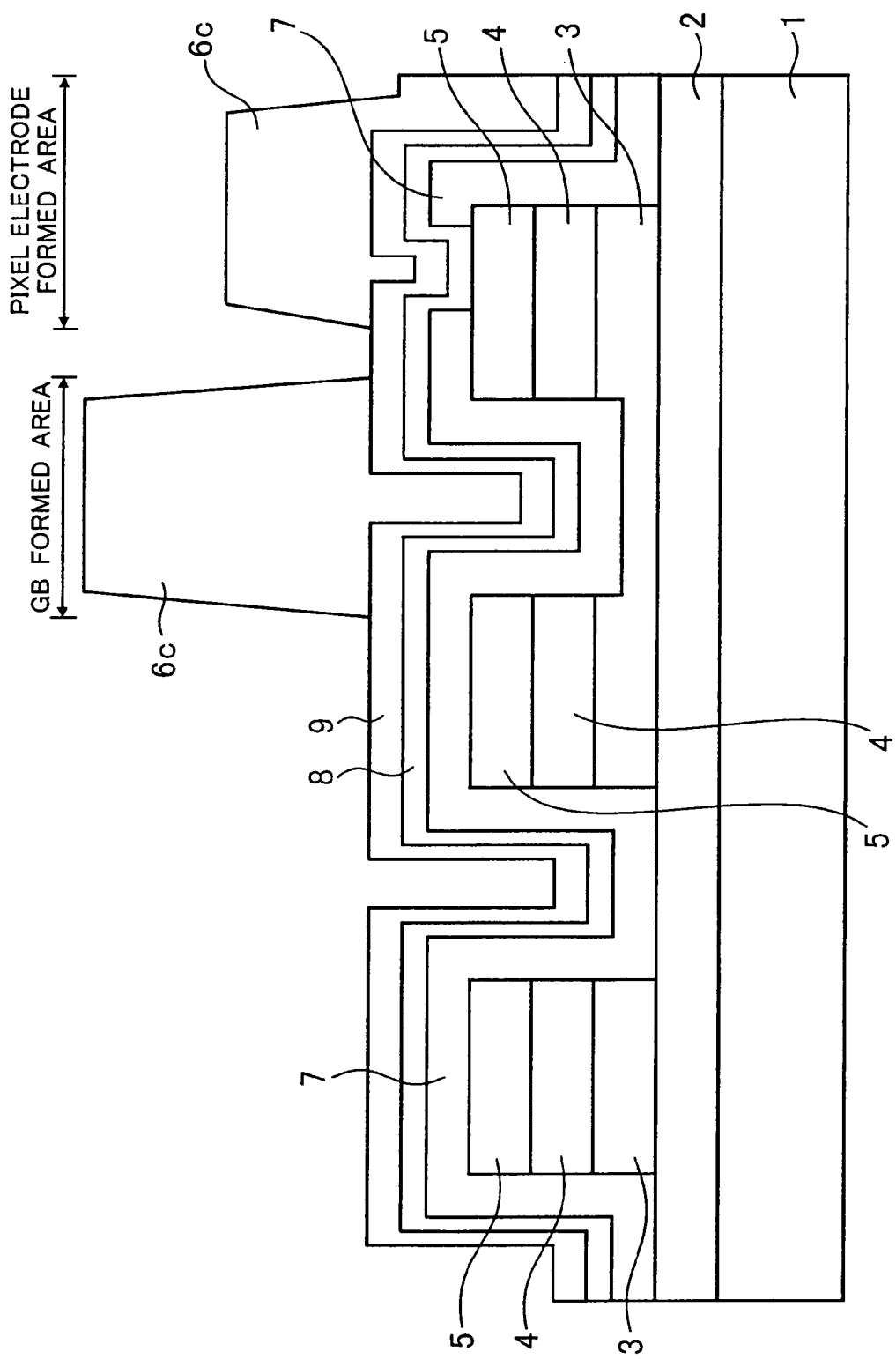
FIG. 16 is a cross-sectional view showing the feature of a third exposure process.
Figure 17:
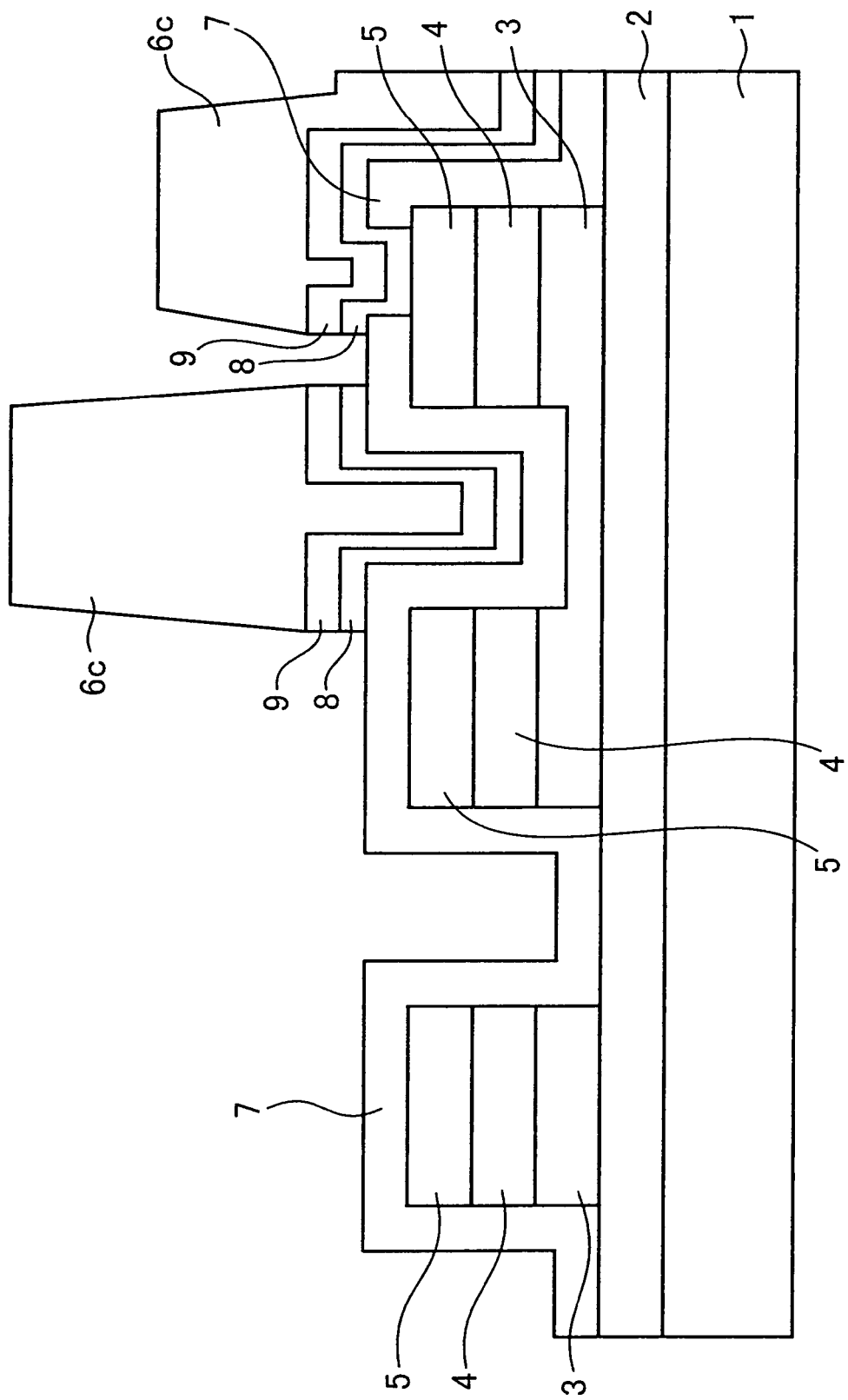
FIG. 17 is a cross-sectional view showing the feature of a transparent conductive film layer and GB layer etching process.
Figure 18:
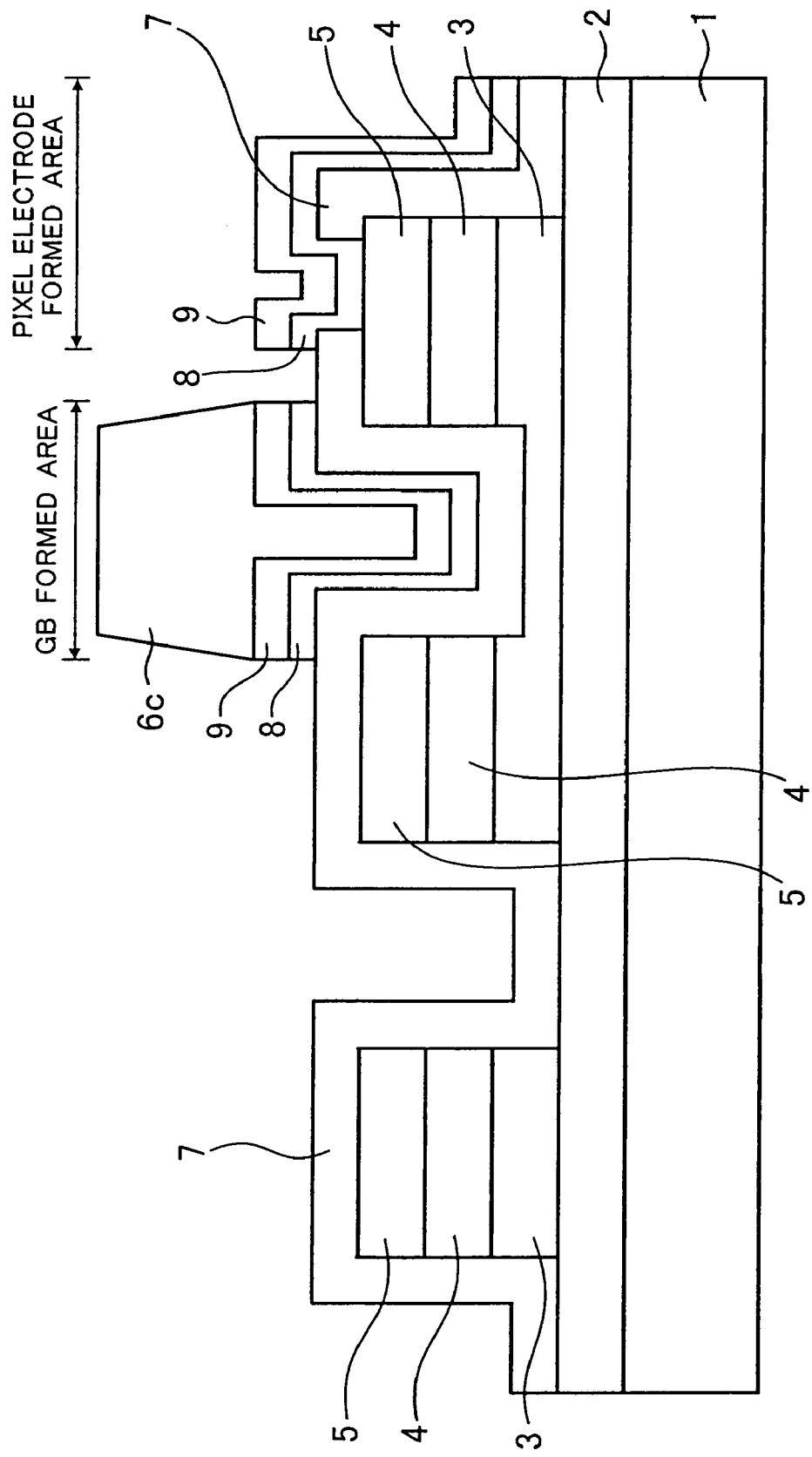
FIG. 18 is a cross-sectional view showing the feature of a second ashing process.

Step S4 will now be described. FIG. 16 is a cross-sectional view showing the feature of a third exposure process. FIG. 17 is a cross-sectional view showing the feature of a transparent conductive film layer and GB layer etching process. FIG. 18 is a cross-sectional view showing the feature of a second ashing process.

After the formation of the transparent conductive film layer 8 and the GB layer 9 shown in FIG. 15, a photoresist 6c is formed and third exposure is performed by the use of a half tone mask, as shown in FIG. 16. In the third exposure process, a resist pattern which masks an area (GB formed area) on the TFT substrate where a GB is to be formed and an area (pixel electrode formed area) on the TFT substrate where a pixel electrode is to be formed is formed. In the photoresist 6c which forms the resist pattern, the thickness in the pixel electrode formed area is thinner than the thickness in the GB formed area. As shown in FIG. 17, the GB layer 9 and the transparent conductive film layer 8 are wet- or dry-etched with the resist pattern as a mask. As shown in FIG. 18, then ashing is performed with $O_2$ until the photoresist 6c in the pixel electrode formed area is removed. As a result, the photoresist 6c remains only in the GB formed area.

Figure 19:
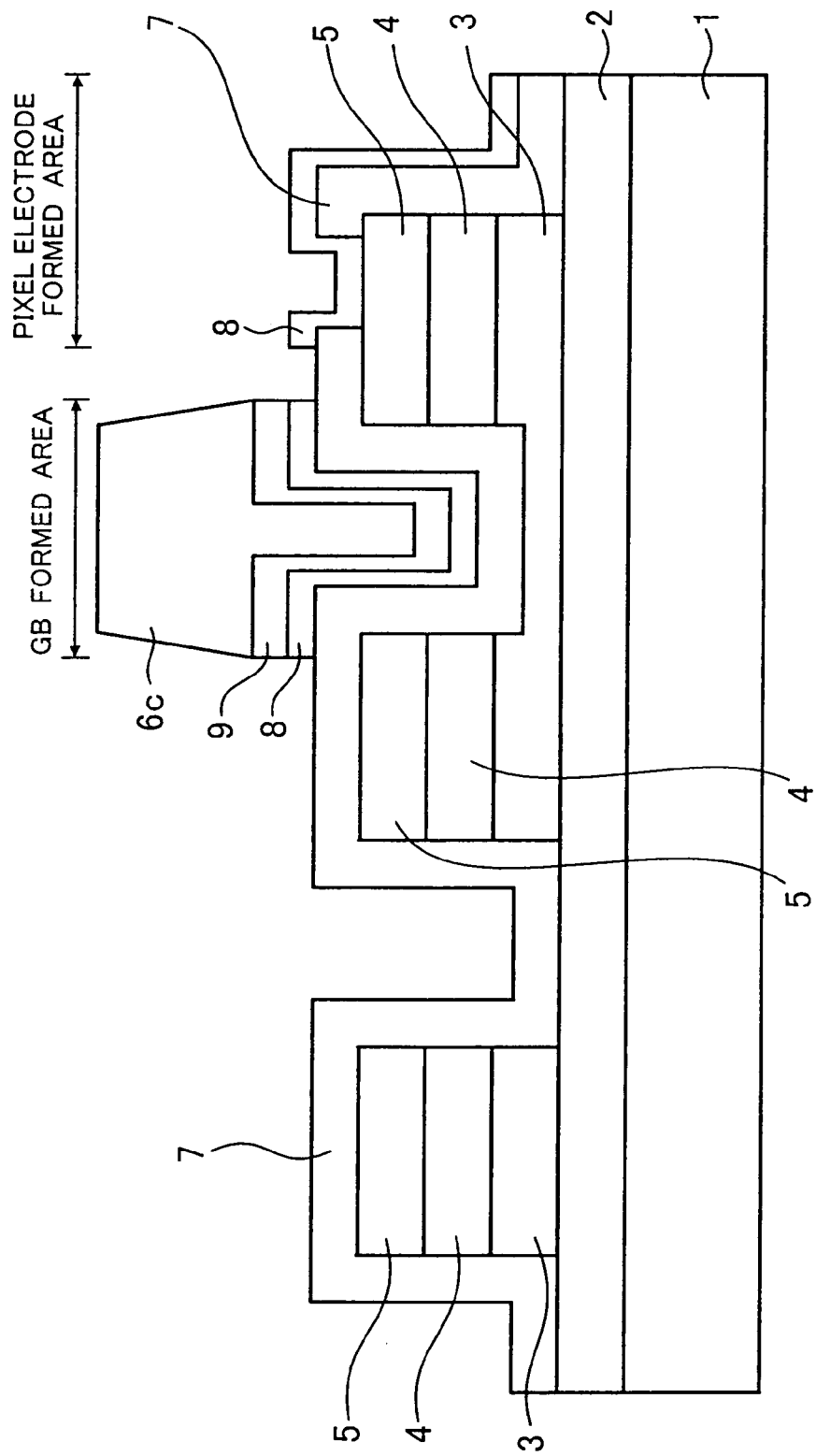
FIG. 19 is a cross-sectional view showing the feature of a GB layer etching process.
Figure 20:
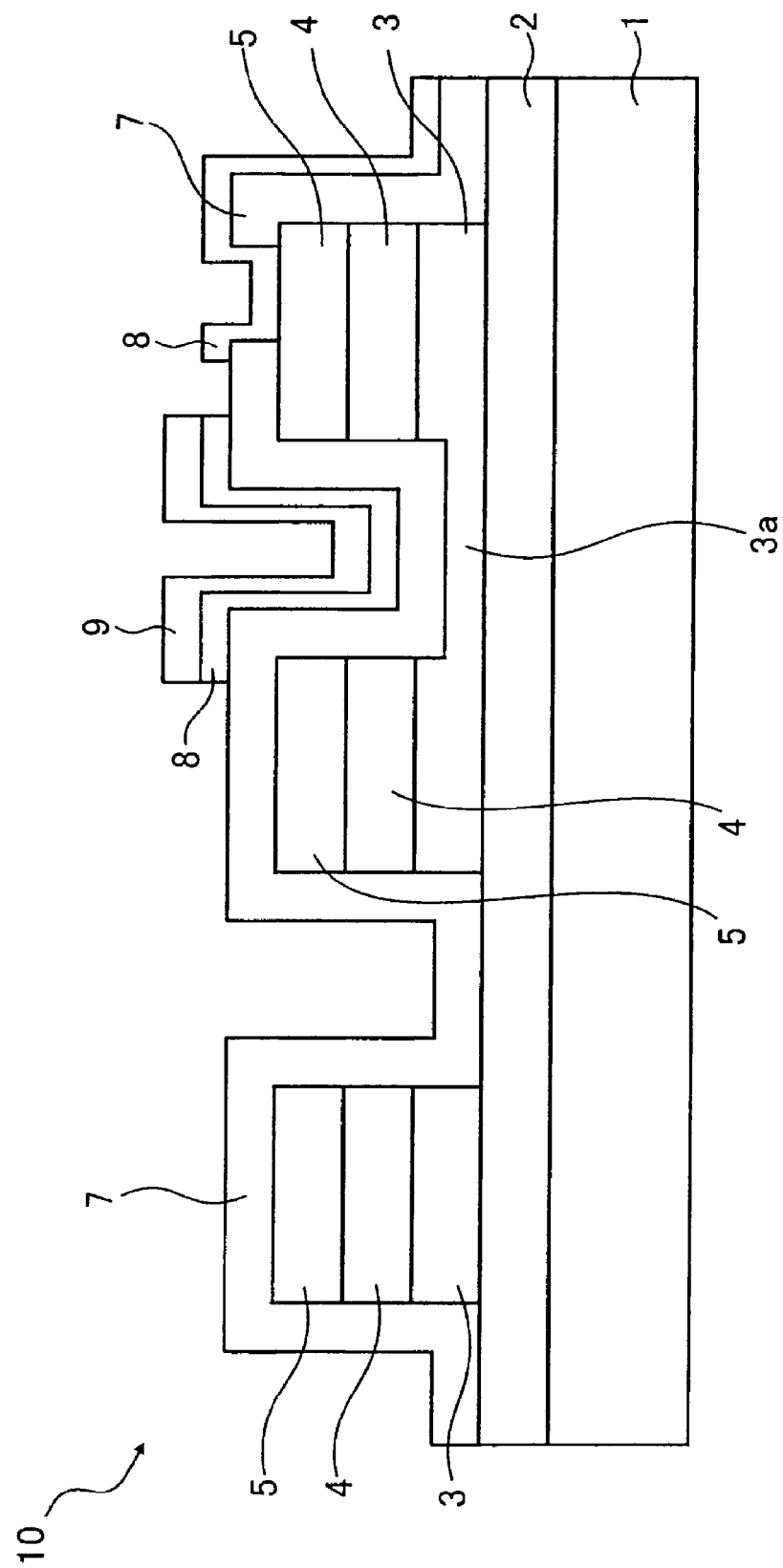
FIG. 20 is a cross-sectional view showing the feature of a resist stripping process performed after the GB layer etching process.
Figure 21:
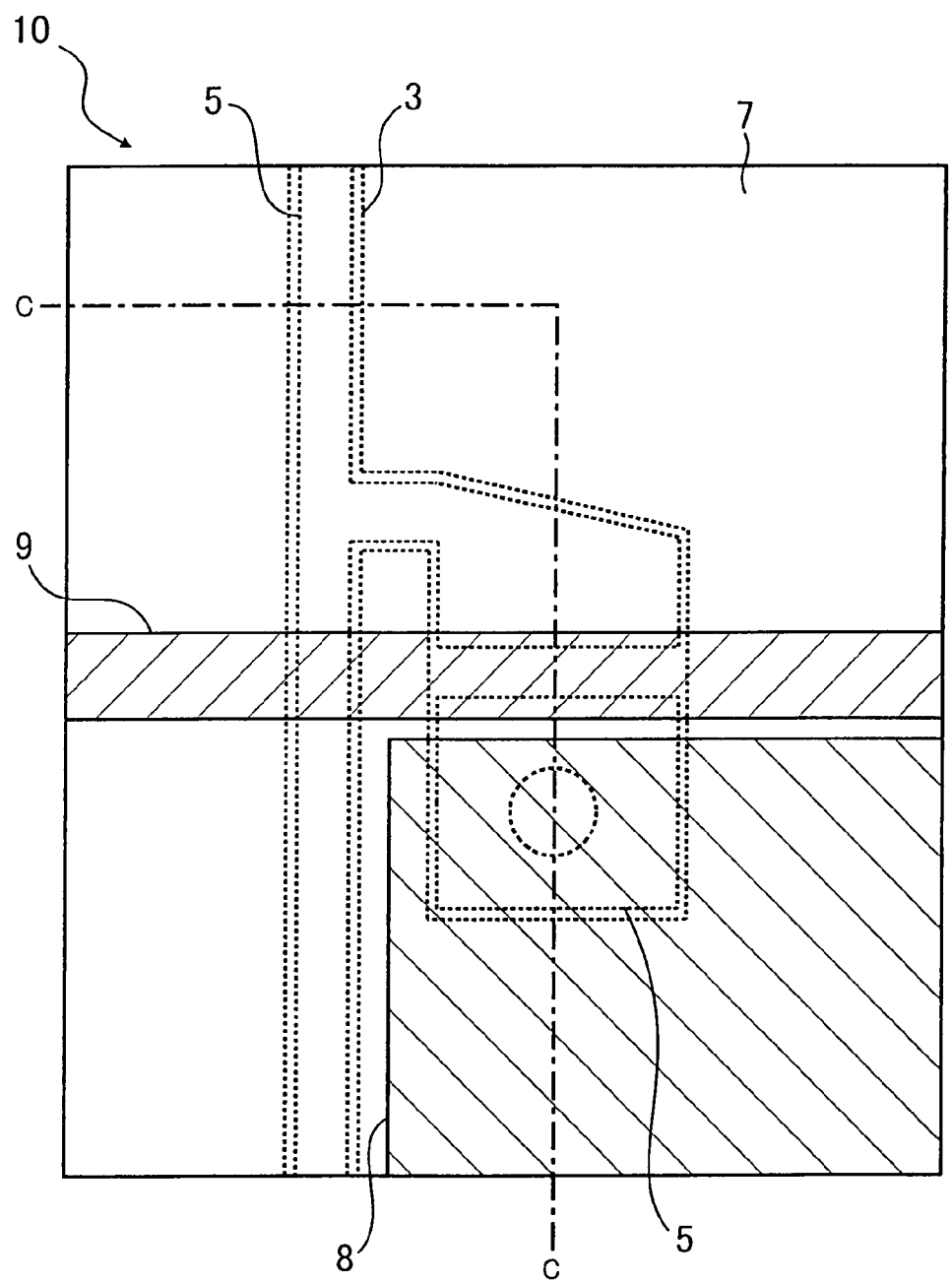
FIG. 21 is a plan view showing the feature of the TFT substrate.

Step S5 will now be described. FIG. 19 is a cross-sectional view showing the feature of a GB layer etching process. FIG. 20 is a cross-sectional view showing the feature of a resist stripping process performed after the GB layer etching process. FIG. 21 is a plan view showing the feature of the TFT substrate. FIG. 20 is a cross-sectional view taken along lines C-C of FIG. 21. For convenience, the operation layer 3 under the DB layer 5 is also shown in FIG. 21.

After the ashing shown in FIG. 18, the GB layer 9 in the pixel electrode formed area is wet- or dry-etched with the photoresist 6c which remains in the GB formed area as a mask, as shown in FIG. 19. Then the photoresist 6c is stripped. As a result, as shown in FIGS. 20 and 21, a TFT substrate 10 including wirings used as the DB and the GB, the operation layer 3 in which a channel 3a is formed, the DB layer 5 formed on the active layer 4 formed on the operation layer 3, and the GB layer 9 formed on the transparent conductive film layer 8 formed on the insulating film 7 formed on the channel 3a is obtained. The operation layer 3 is formed on the foundation insulating film layer 2 formed on the glass substrate 1.

In the TFT substrate 10, the exposed transparent conductive film layer 8 functions as the pixel electrode and one DB layer 5 which is in contact with the under side of the transparent conductive film layer 8 functions as a source electrode of the TFT. The other DB layer 5 opposite to the above DB layer 5 functions as a drain electrode of the TFT and the top GB layer 9 functions as a gate electrode of the TFT. The insulating film 7 between the gate electrode and the channel 3a is the gate insulator of the TFT.

As described above, in the method for fabricating a stagger type TFT substrate according to the first embodiment of the present invention, the exposure in the first exposure process is performed with one half tone mask to form the resist pattern which masks the DB formed area, the TFT formed area, and the channel formed area. In addition, the exposure in the third exposure process is performed with another half tone mask to form the resist pattern which masks the GB formed area and the pixel electrode formed area. Conventionally, four different masks are necessary for forming four resist patterns which mask the DB formed area and TFT formed area, the channel formed area, the GB formed area, and the pixel electrode formed area respectively. That is to say, an exposure process must be performed four times. In the method for fabricating a stagger type TFT substrate according to the first embodiment of the present invention, however, two half tone masks are used. This reduces the number of times an exposure process is performed from four to two. By adding the above second exposure process, the total number of times an exposure process is performed in the method for fabricating a stagger type TFT substrate according to the first embodiment of the present invention is three. Therefore, by simplifying a method for manufacturing a TFT substrate, productivity can be improved. Furthermore, by reducing the number of times an exposure process is performed in this way, a yield in manufacturing TFT substrates will rise and manufacturing costs can be reduced. High-quality stagger type TFT substrates having no display defects can be manufactured.

In the method for fabricating a stagger type TFT substrate according to the first embodiment of the present invention, a half tone mask may be used only in one exposure process. That is to say, a half tone mask may be used only in one exposure process to form the resist pattern which masks the DB formed area, the TFT formed area, and the channel formed area and ordinary masks may be used to form resist patterns which mask the GB formed area and the pixel electrode formed area respectively. Moreover, a half tone mask may be used only in one exposure process to form the resist pattern which masks the GB formed area and the pixel electrode formed area and ordinary masks may be used to form resist patterns which mask the DB formed area, the TFT formed area, and the channel formed area respectively.

Furthermore, in the method for fabricating a stagger type TFT substrate according to the first embodiment of the present invention, the glass substrate 1 is an insulator in nature and there is no need to form the foundation insulating film layer 2. A procedure to be followed in the case of the foundation insulating film layer 2 not being formed differs from the above procedure only in that the operation layer 3 is formed directly on the glass substrate 1.

In the channel etching process shown in FIG. 8, the following procedure may be adopted. After the DB layer 5 is etched, all the photoresist 6a is removed by, for example, ashing and the active layer 4 and the operation layer 3 are etched with the exposed DB layer 5 as a mask. This decreases a deviation of channel width from a design value after the etching due to a shrinkage in the photoresist 6a by the ashing in the first ashing process shown in FIG. 7. Therefore, channel etching can be performed with greater accuracy.

Moreover, in the second exposure process and the insulating film etching process shown in FIGS. 12 and 13 respectively, at the same time that the contact hole 7a is formed, contact holes may be made in areas (not shown) in the insulating film 7 where a terminal for the DB layer 5 and a terminal for a storage capacitance bus-line (CB) layer are to be formed.

Figure 22:
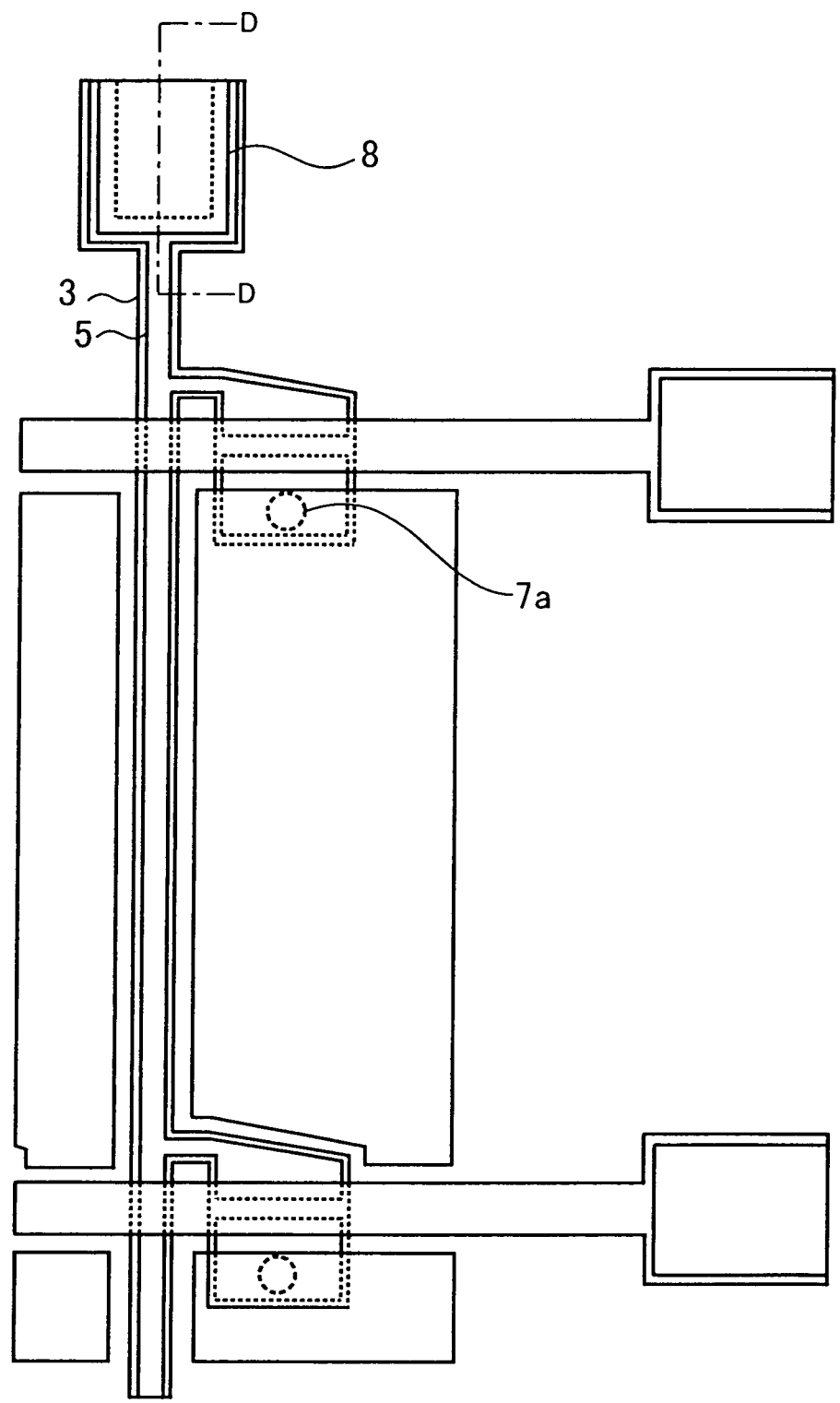
FIG. 22 is a plan view showing the feature of a TFT substrate according to the first embodiment of the present invention.
Figure 23:
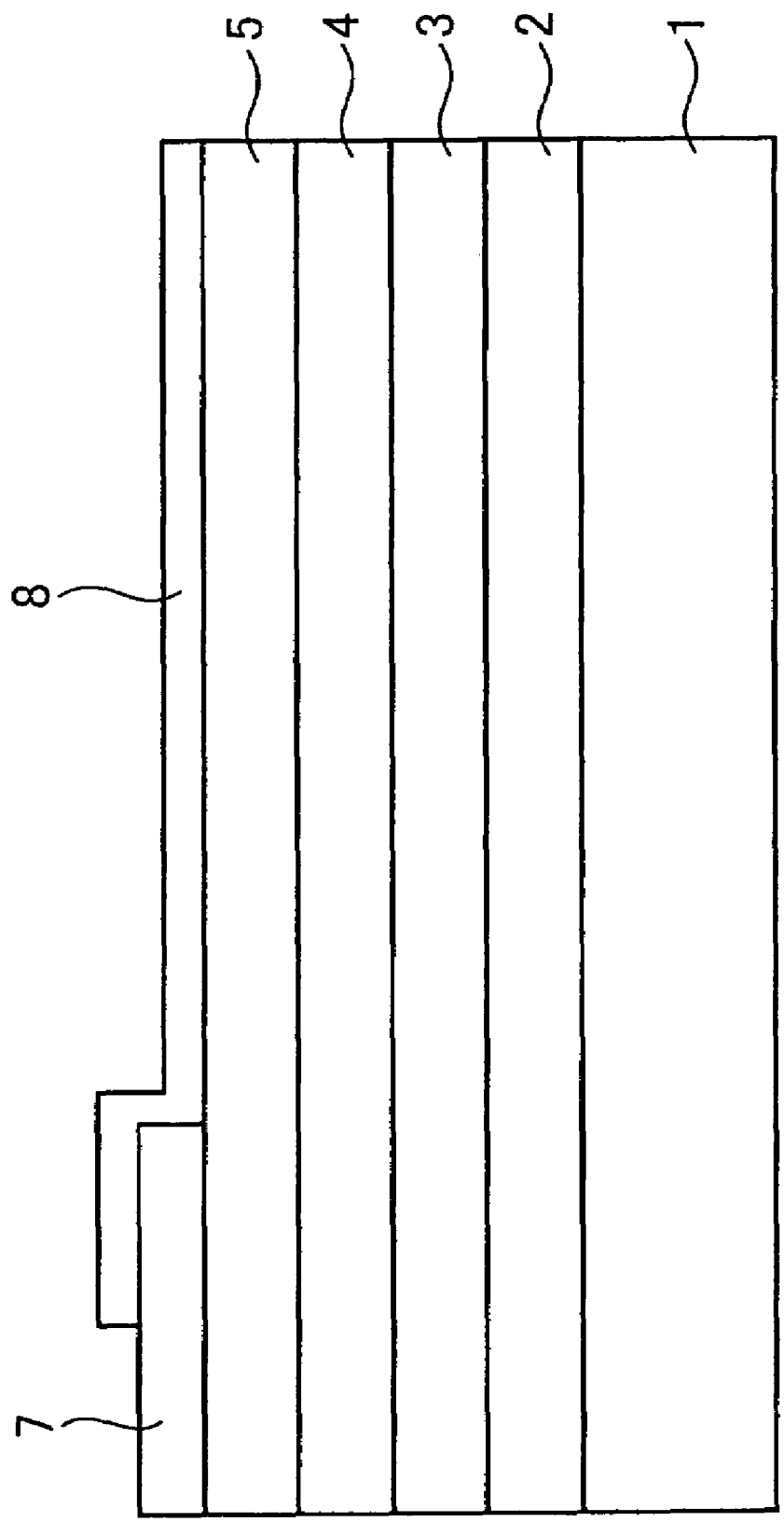
FIG. 23 is a cross-sectional view taken along lines D-D of FIG. 22.

The structure of terminals on a TFT substrate will now be described. FIG. 22 is a plan view showing the feature of a TFT substrate according to the first embodiment of the present invention. FIG. 23 is a cross-sectional view taken along lines D-D of FIG. 22. For convenience, an operation layer 3 under a DB layer 5 is also shown in FIG. 22. As shown in FIGS. 22 and 23, on the TFT substrate according to the first embodiment of the present invention, a drain terminal formed on a edge portion of the DB layer 5 has a structure in which a transparent conductive film layer 8 is formed on the DB layer 5 so that it will overlap with an insulating film 7. This drain terminal may have a structure shown in FIGS. 24 through 29. This structure is realized by making a contact hole in the insulating film 7 on the DB layer 5.

Figure 24:
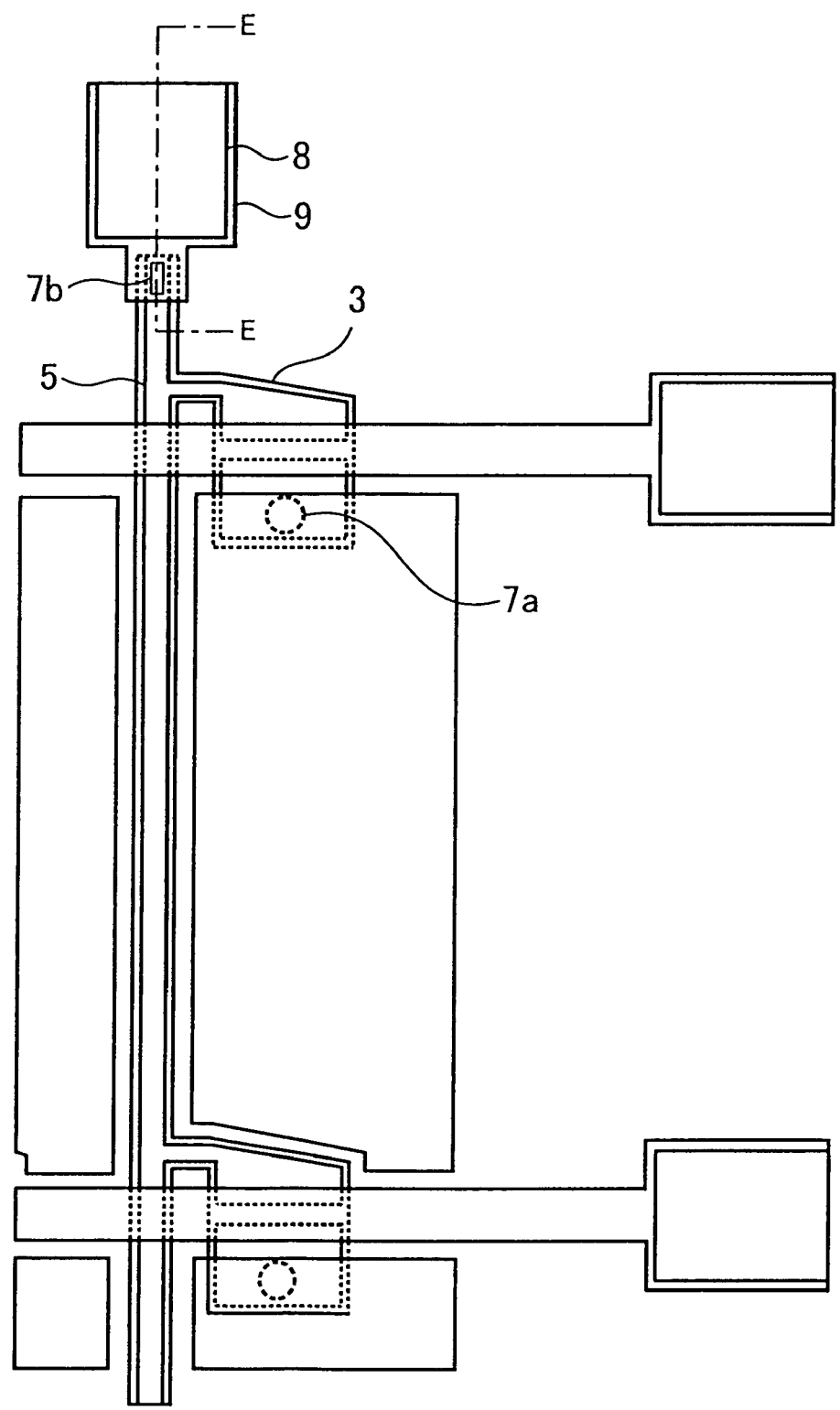
FIG. 24 is a plan view showing the feature of a TFT substrate for describing the structure of a drain terminal.
Figure 25:
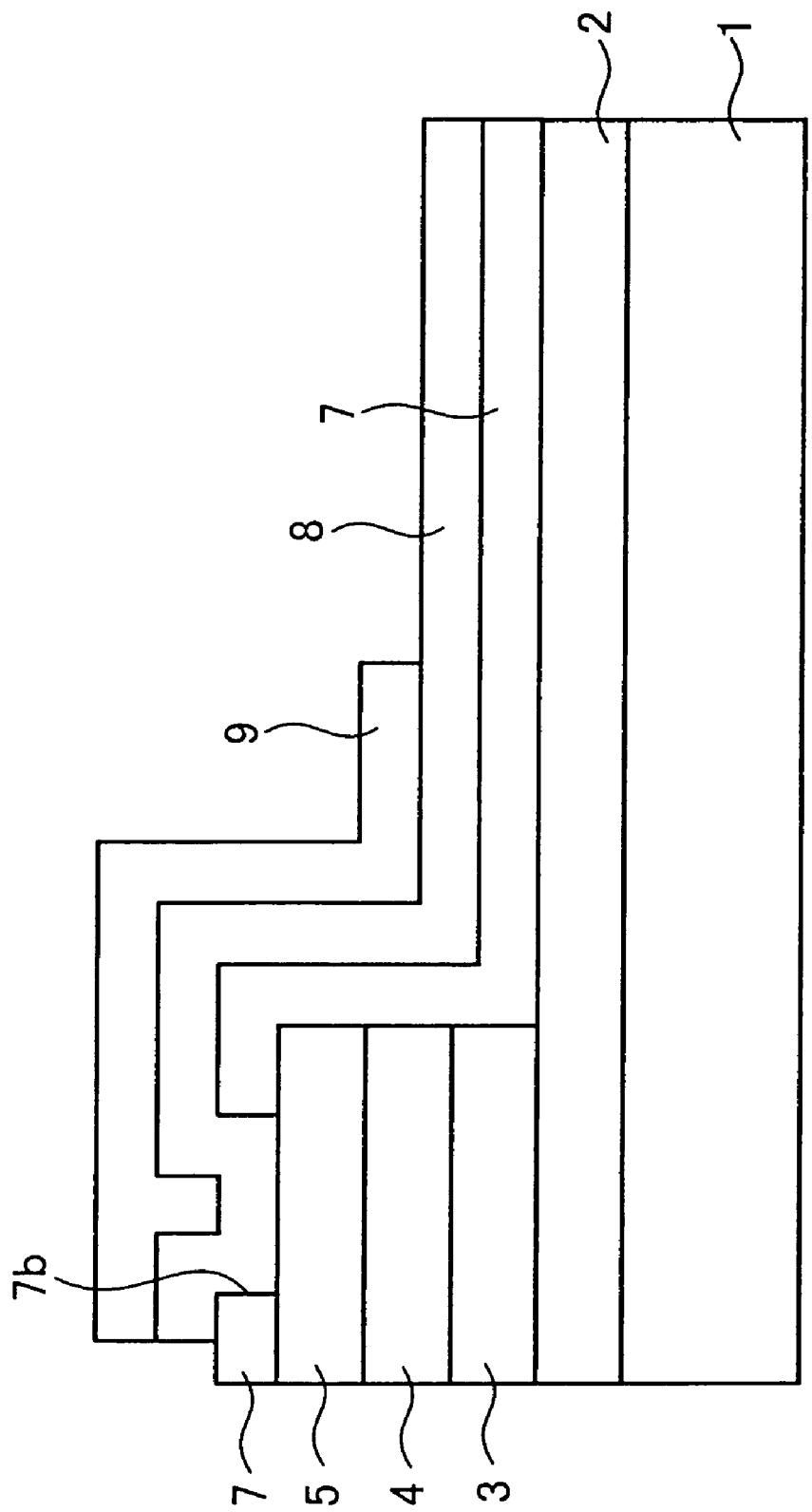
FIG. 25 is a cross-sectional view taken along lines E-E of FIG. 24.

FIG. 24 is a plan view showing the feature of a TFT substrate for describing the structure of the drain terminal. FIG. 25 is a cross-sectional view taken along lines E-E of FIG. 24. For convenience, the operation layer 3 under the DB layer 5 is also shown in FIG. 24. In the drain terminal shown in FIGS. 24 and 25, the DB layer 5 is connected to the transparent conductive film layer 8 and a GB layer 9 via a contact hole 7b made in the insulating film 7 on the DB layer 5. The drain terminal having this structure is formed in the following way. First, in the insulating film etching process shown in FIG. 13, at the same time that a contact hole 7a is formed, the contact hole 7b is formed in an area (drain terminal formed area) where the drain terminal is to be formed. Then the transparent conductive film layer and GB layer formation process shown in FIG. 15 is performed. In the third exposure process shown in FIG. 16, the drain terminal formed area is treated as a GB formed area and a thick photoresist 6c is formed both in a GB formed area and in the drain terminal formed area. Then the same processes that are shown in FIGS. 17 through 21 are performed. As stated above, by forming the contact hole 7b in the drain terminal formed area, in the drain terminal the DB layer 5 can be connected to the GB layer 9 via the transparent conductive film layer 8.

Figure 26:
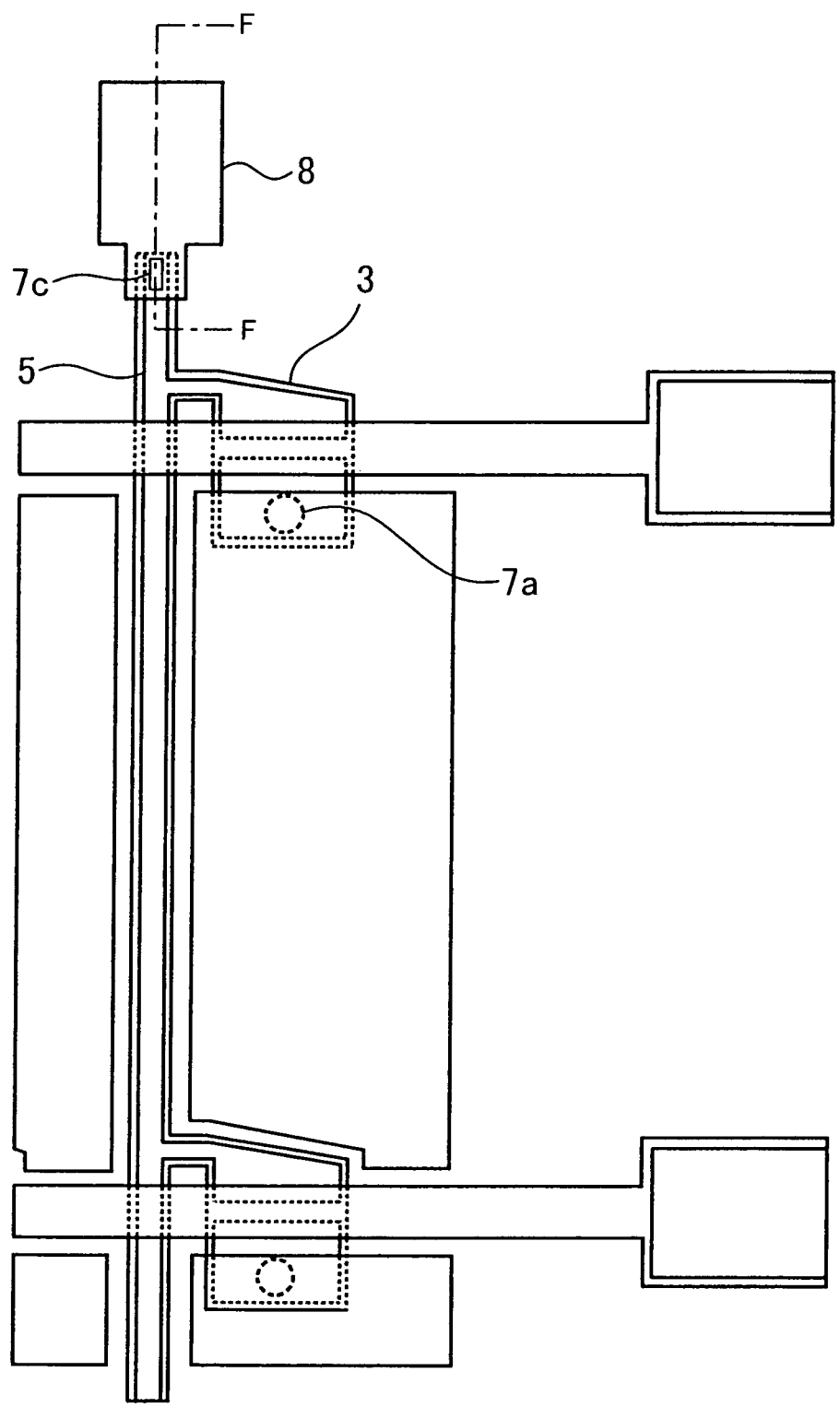
FIG. 26 is a plan view showing the feature of a TFT substrate for describing another structure of the drain terminal.
Figure 27:
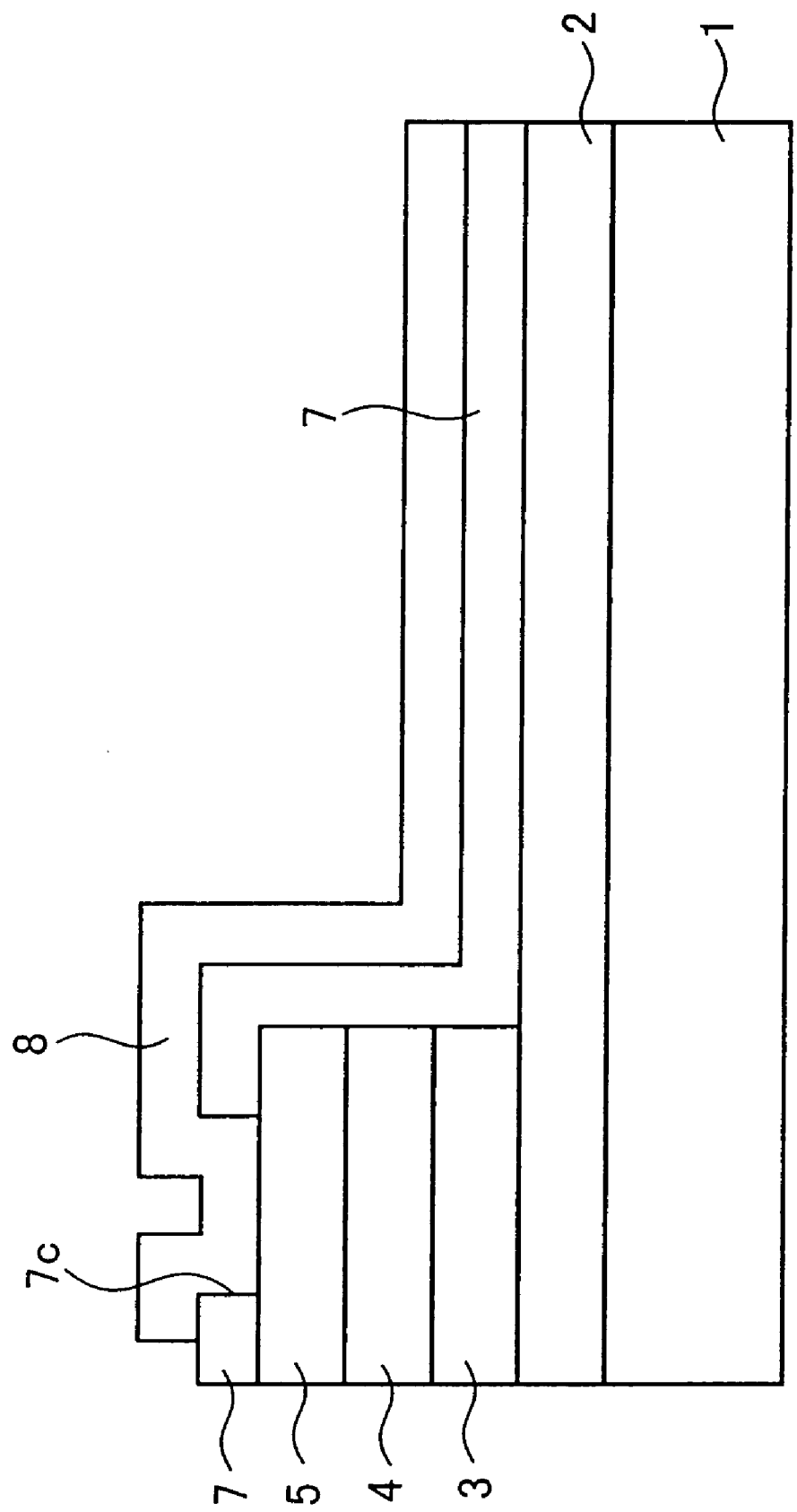
FIG. 27 is a cross-sectional view taken along lines F-F of FIG. 26.

FIG. 26 is a plan view showing the feature of a TFT substrate for describing another structure of the drain terminal. FIG. 27 is a cross-sectional view taken along lines F-F of FIG. 26. For convenience, an operation layer 3 under a DB layer 5 is also shown in FIG. 26. In the drain terminal shown in FIGS. 26 and 27, the DB layer 5 is connected to a transparent conductive film layer 8 via a contact hole 7c made in an insulating film 7 on the DB layer 5. The drain terminal having this structure is formed in the following way. First, in the insulating film etching process shown in FIG. 13, at the same time that a contact hole 7a is formed, the contact hole 7c is formed in a drain terminal formed area. Then the transparent conductive film layer and GB layer formation process shown in FIG. 15 is performed. In the third exposure process shown in FIG. 16, the drain terminal formed area is treated as a pixel electrode formed area and a thin photoresist 6c is formed both in a pixel electrode formed area and in the drain terminal formed area. Then the same processes that are shown in FIGS. 17 through 21 are performed. As stated above, in the drain terminal the DB layer 5 can be connected to the transparent conductive film layer 8 via the contact hole 7c.

Figure 28:
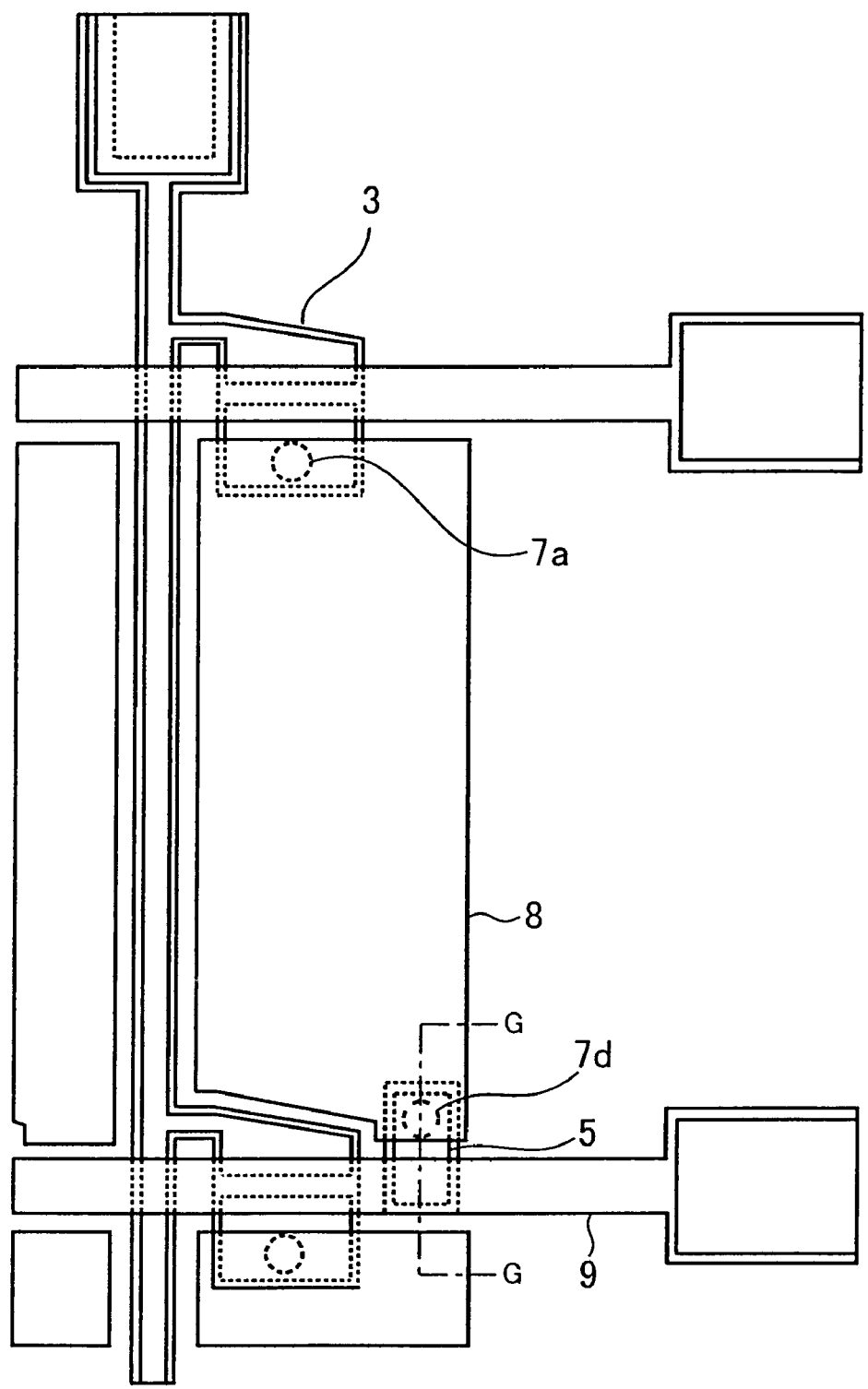
FIG. 28 is a plan view showing the feature of a TFT substrate for describing the structure of a terminal for a CB.
Figure 29:
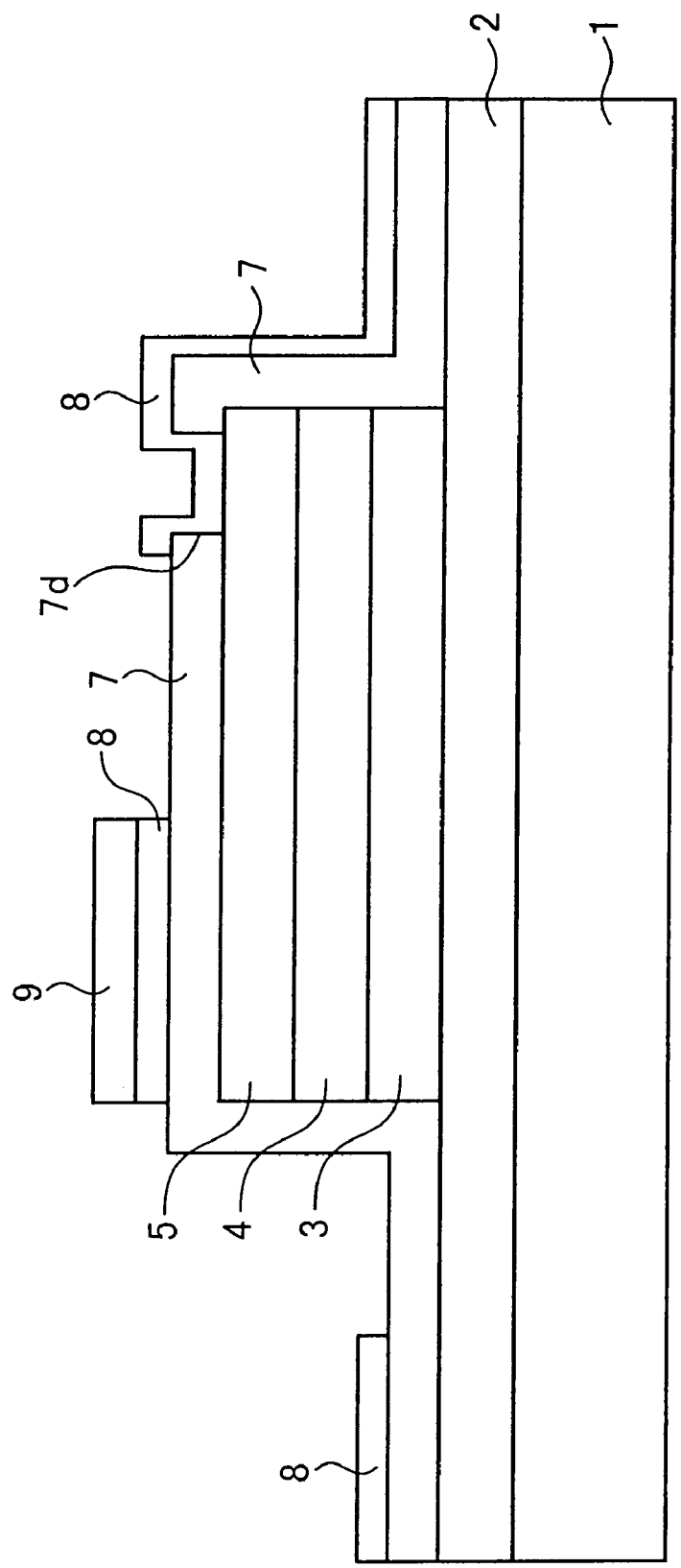
FIG. 29 is a cross-sectional view taken along lines G-G of FIG. 28.

FIG. 28 is a plan view showing the feature of a TFT substrate for describing the structure of a terminal for a CB. FIG. 29 is a cross-sectional view taken along lines G-G of FIG. 28. For convenience, an operation layer 3 under a DB layer 5 is also shown in FIG. 28. A CB is formed on a TFT substrate in the following way. In the insulating film etching process shown in FIG. 13, at the same time that a contact hole 7a is formed, a contact hole 7d is formed in an area (CB formed area) where the CB is to be formed. Then the transparent conductive film layer and GB layer formation process shown in FIG. 15 is performed. In the third exposure process shown in FIG. 16, a photoresist 6c is formed so that it will thin in a pixel electrode formed area on the CB (where a transparent conductive film layer 8 is to be left) and so that it will thick in the GB formed area on the CB (where a GB layer 9 is to be left). Then the CB is formed by the same processes that are shown in FIGS. 17 through 21. As a result, the transparent conductive film layer 8 comes into contact with the DB layer 5 via the contact hole 7d.

As described above, in the method for fabricating a stagger type TFT substrate according to the first embodiment of the present invention, the drain terminal and the terminal for the CB can be formed at the same time the TFT substrate is formed. Accordingly, the structure of the terminals can be changed without increasing the number of the processes.

A second embodiment of the present invention will now be described.

Figure 30:
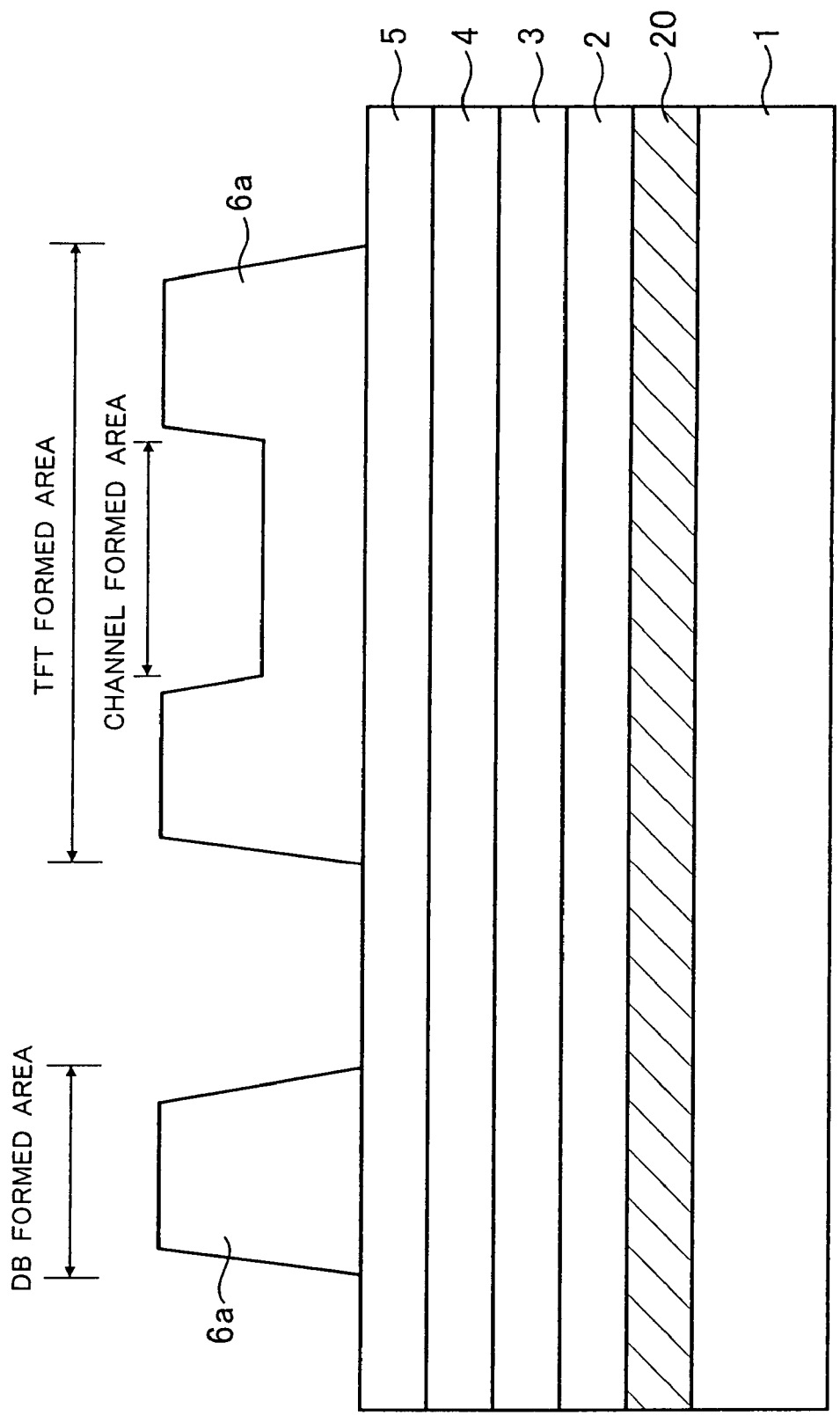
FIG. 30 is a cross-sectional view showing the feature of a first exposure process in a method for fabricating a stagger type TFT substrate according to a second embodiment of the present invention.
Figure 31:
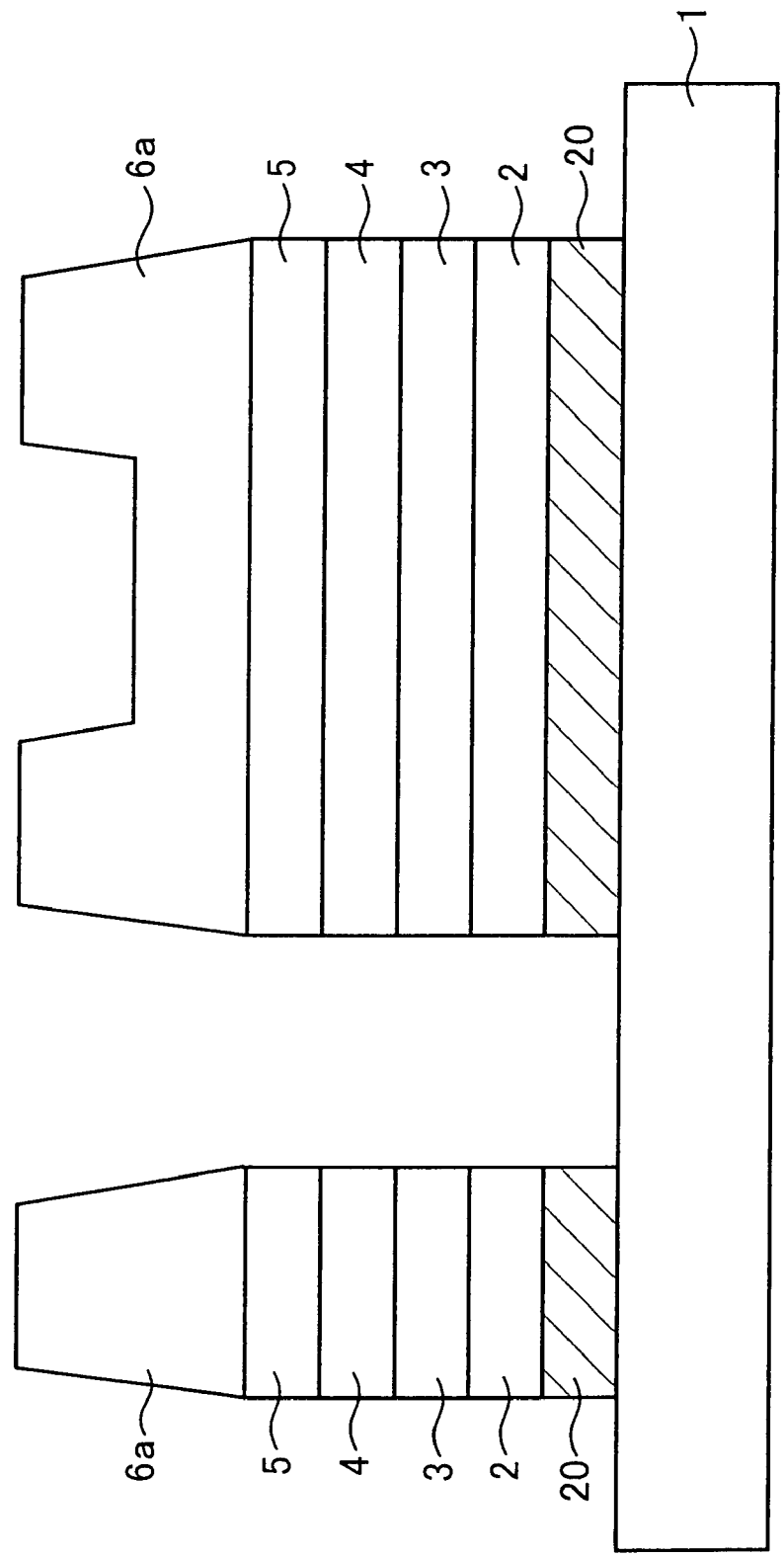
FIG. 31 is a cross-sectional view showing the feature of an etching process performed after the first exposure process in the method for fabricating a stagger type TFT substrate according to the second embodiment of the present invention.

When a stagger type TFT substrate is fabricated, a light shading film may be formed between a glass substrate and a foundation insulating film layer. FIG. 30 is a cross-sectional view showing the feature of a first exposure process in a method for fabricating a stagger type TFT substrate according to a second embodiment of the present invention. FIG. 31 is a cross-sectional view showing the feature of an etching process performed after the first exposure process in the method for fabricating a stagger type TFT substrate according to the second embodiment of the present invention. Components in FIGS. 30 and 31 which are the same as those shown in FIGS. 3 and 6 are designated by identical reference numerals and detailed descriptions of them will be omitted.

In the method for fabricating a stagger type TFT substrate according to the second embodiment of the present invention, as shown in FIG. 30, a light shading film 20 is formed first on a glass substrate 1, then a foundation insulating film layer 2, an operation layer 3, an active layer 4, and a DB layer 5 are continuously formed. A resin insulating material, for example, can be used for forming the light shading film 20. A photoresist 6a is formed. First exposure is performed with a half tone mask to form a resist pattern having predetermined thicknesses in a DB formed area and a TFT formed area. This is the same with the first embodiment. As shown in FIG. 31, in an etching process performed after the first exposure process, the DB layer 5, the active layer 4, the operation layer 3, the foundation insulating film layer 2, and the light shading film 20 are wet- or dry-etched with the resist pattern of the photoresist 6a as a mask. Then the same processes that are shown in FIGS. 7 through 19 are performed to form a TFT substrate.

As a result, in the TFT substrate formed, the light shading film 20 is formed under the operation layer 3. Even if light enters from the glass substrate 1 side, this prevents an electric current from flowing in the operation layer 3. As described above, by using the half tone mask for the exposure in the case of fabricating the stagger type TFT substrate including the light shading film 20, the total number of exposure processes performed for fabricating the TFT substrate can be reduced, compared with conventional methods.

In the method for fabricating a stagger type TFT substrate according to the second embodiment of the present invention, the structure of terminals can be changed. This is the same with the first embodiment.

A third embodiment of the present invention will now be described.

In a method for fabricating a stagger type TFT substrate according to a third embodiment of the present invention, the same processes that are shown in FIGS. 2, 3, and 6 through 9 in the method for fabricating a stagger type TFT substrate according to the first embodiment of the present invention are performed. Processes performed after them will now be described with reference to FIGS. 32 through 43. Components in FIGS. 32 through 43 which are the same as those described in the first embodiment are designated by identical reference numerals and detailed descriptions of them will be omitted.

Figure 32:
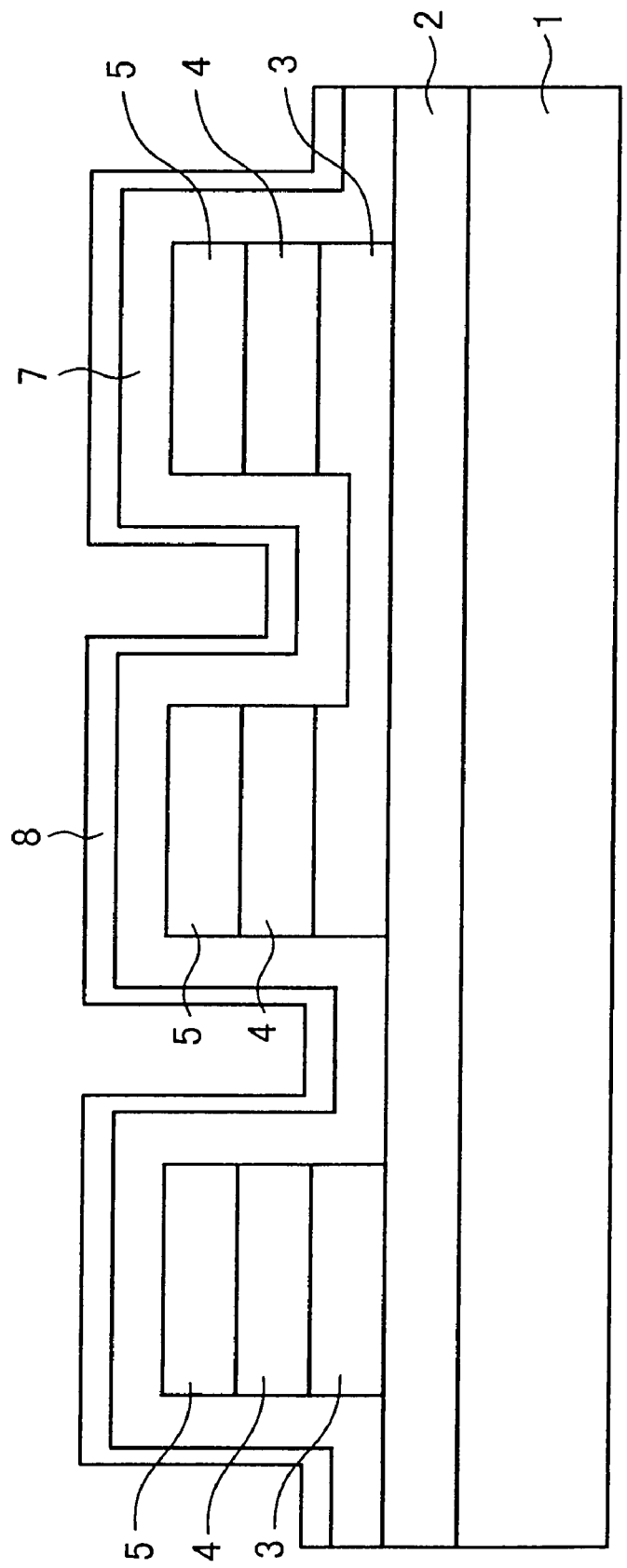
FIG. 32 is a cross-sectional view showing the feature of an insulating film and transparent conductive film layer formation process.
Figure 33:
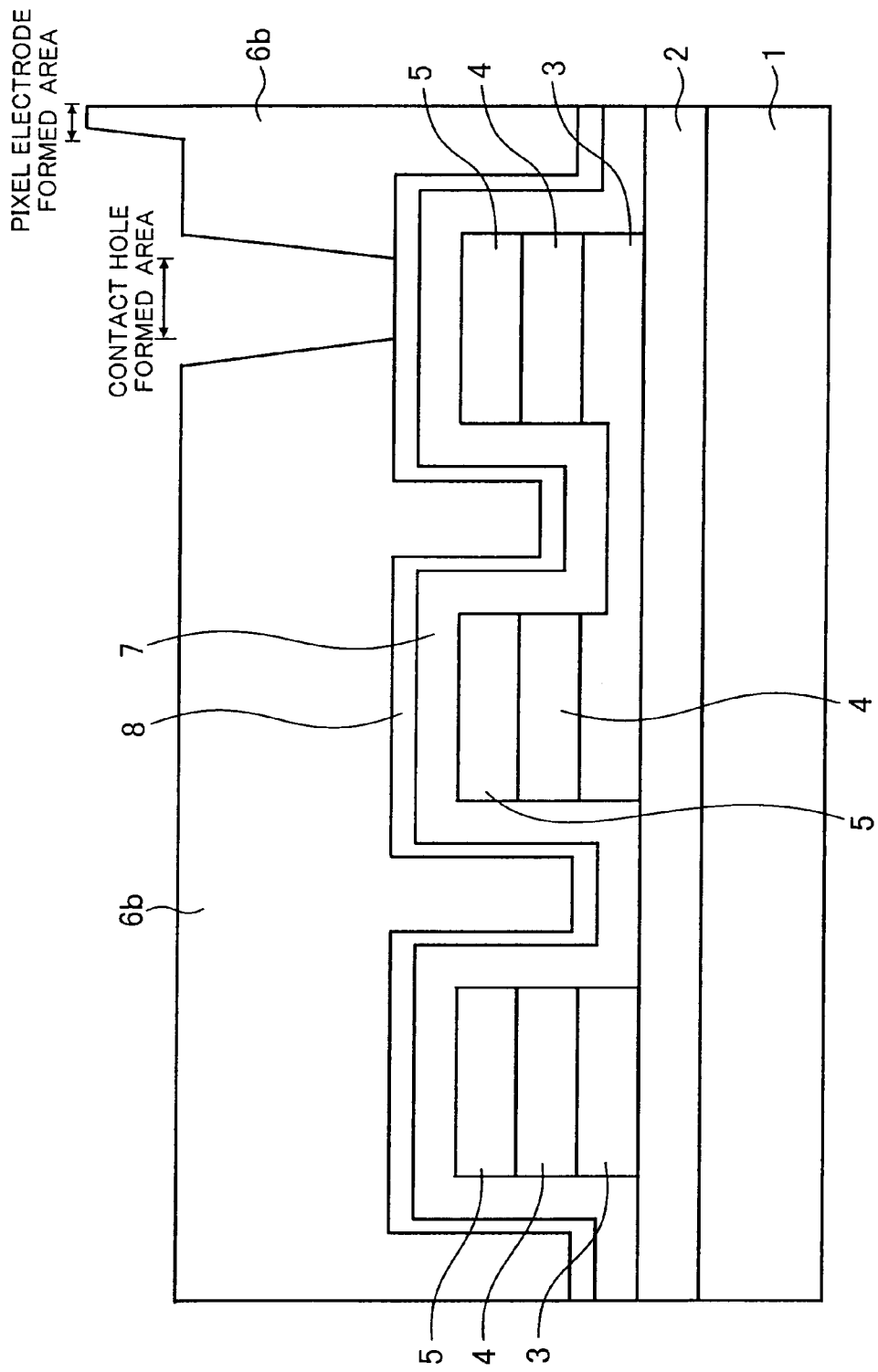
FIG. 33 is a cross-sectional view showing the feature of a second exposure process in a method for fabricating a stagger type TFT substrate according to a third embodiment of the present invention.
Figure 34:
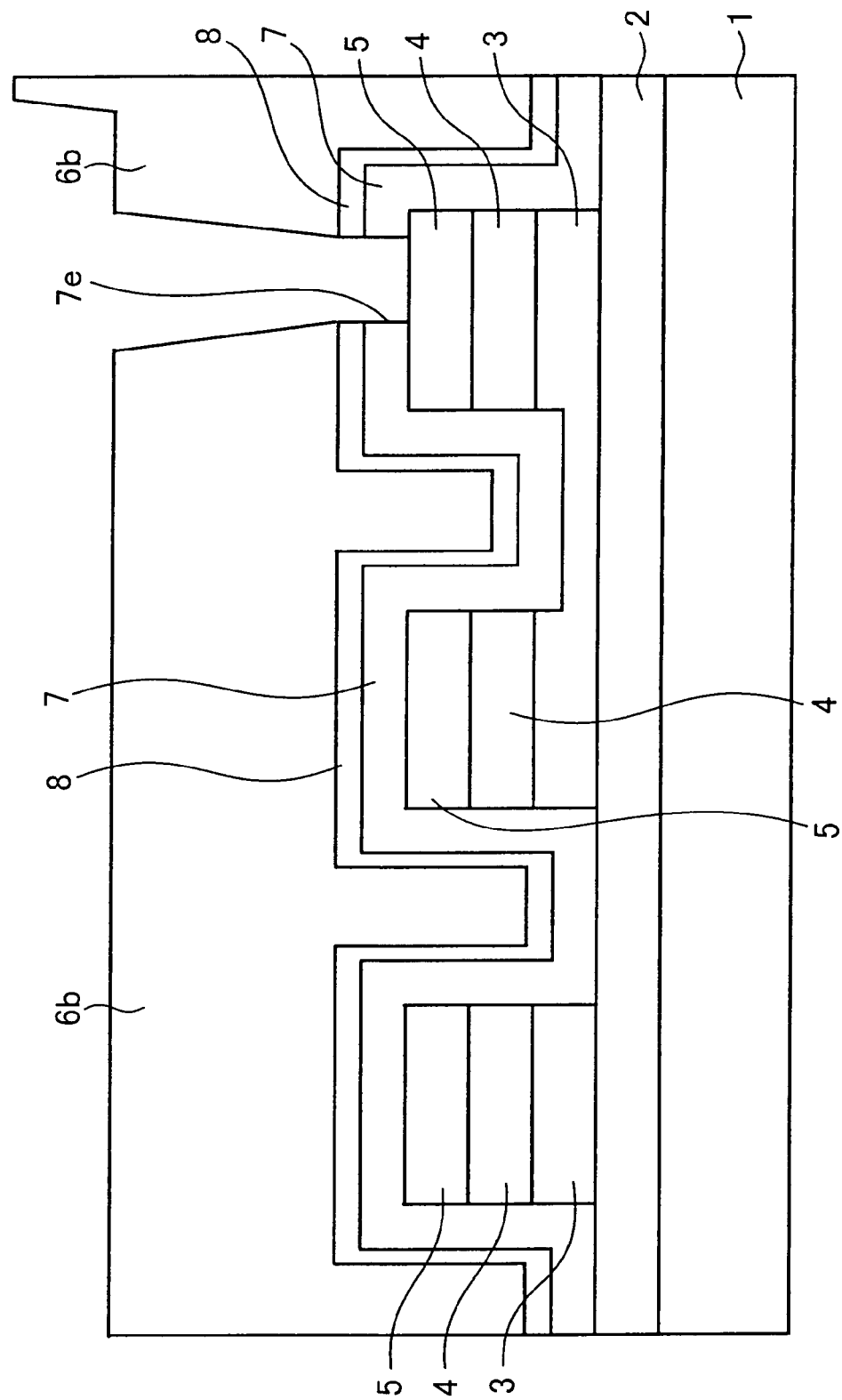
FIG. 34 is a cross-sectional view showing the feature of a transparent conductive film layer and insulating film etching process.
Figure 35:
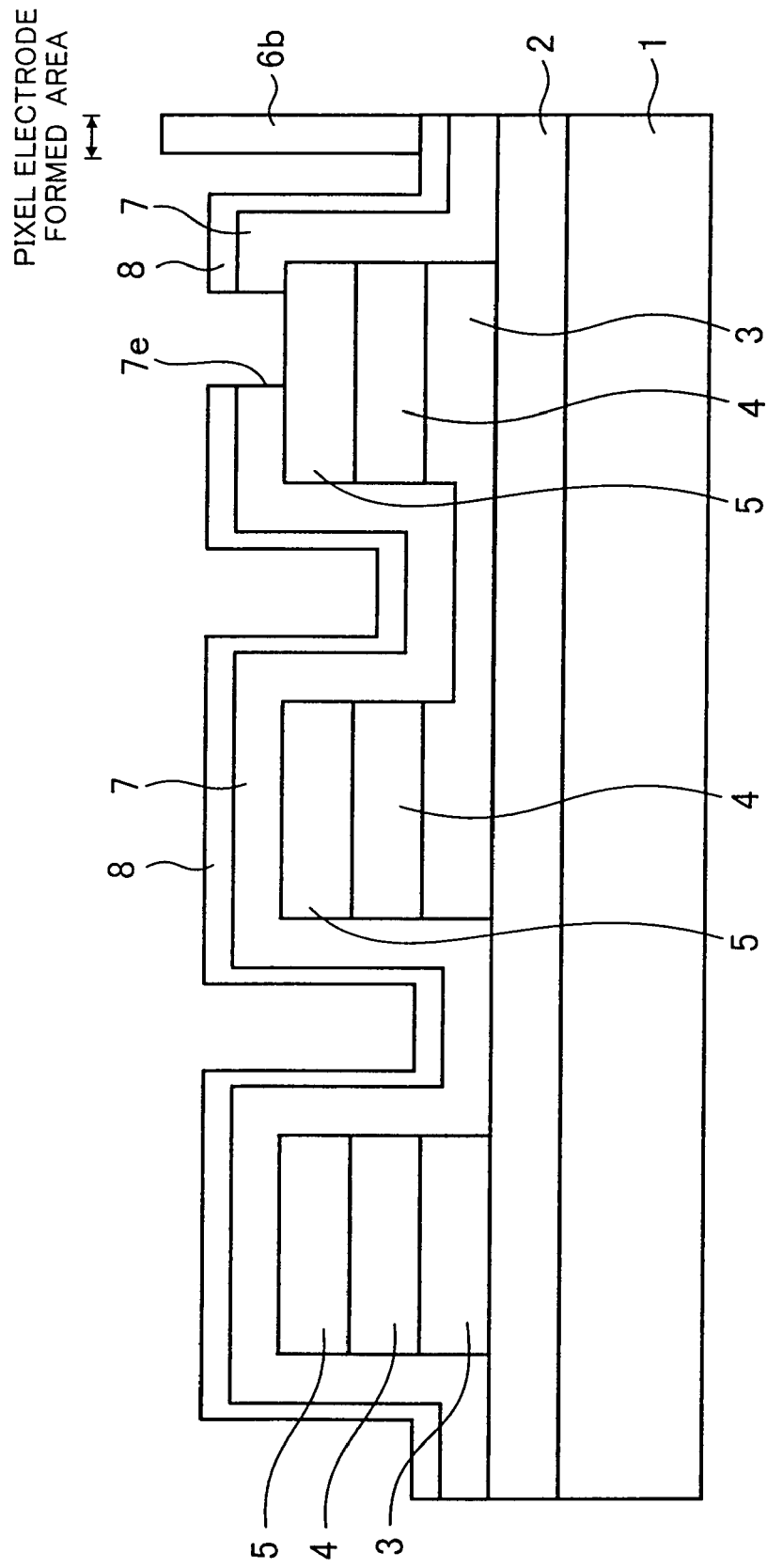
FIG. 35 is a cross-sectional view showing the feature of an ashing process.

FIG. 32 is a cross-sectional view showing the feature of an insulating film and transparent conductive film layer formation process. FIG. 33 is a cross-sectional view showing the feature of a second exposure process in the method for fabricating a stagger type TFT substrate according to the third embodiment of the present invention. FIG. 34 is a cross-sectional view showing the feature of a transparent conductive film layer and insulating film etching process. FIG. 35 is a cross-sectional view showing the feature of an ashing process.

After the resist stripping process shown in FIG. 9 is performed, an insulating film 7 and a transparent conductive film layer 8 are formed on the entire surface as shown in FIG. 32. As shown in FIG. 33, then a photoresist 6b is formed on the transparent conductive film layer 8 and second exposure is performed with a half tone mask. In the second exposure process, the thickness of the photoresist 6b in a pixel electrode formed area is made greater than that of the photoresist 6b in the other areas. In addition, in the second exposure process, a resist pattern in which a taper opening is made in a contact hole formed area is formed. As shown in FIG. 34, then the transparent conductive film layer 8 and the insulating film 7 are etched with the resist pattern of the photoresist 6b as a mask to make a contact hole 7e. As shown in FIG. 35, the ashing of the photoresist 6b is performed so that the photoresist 6b will remain only in the pixel electrode formed area.

Figure 36:
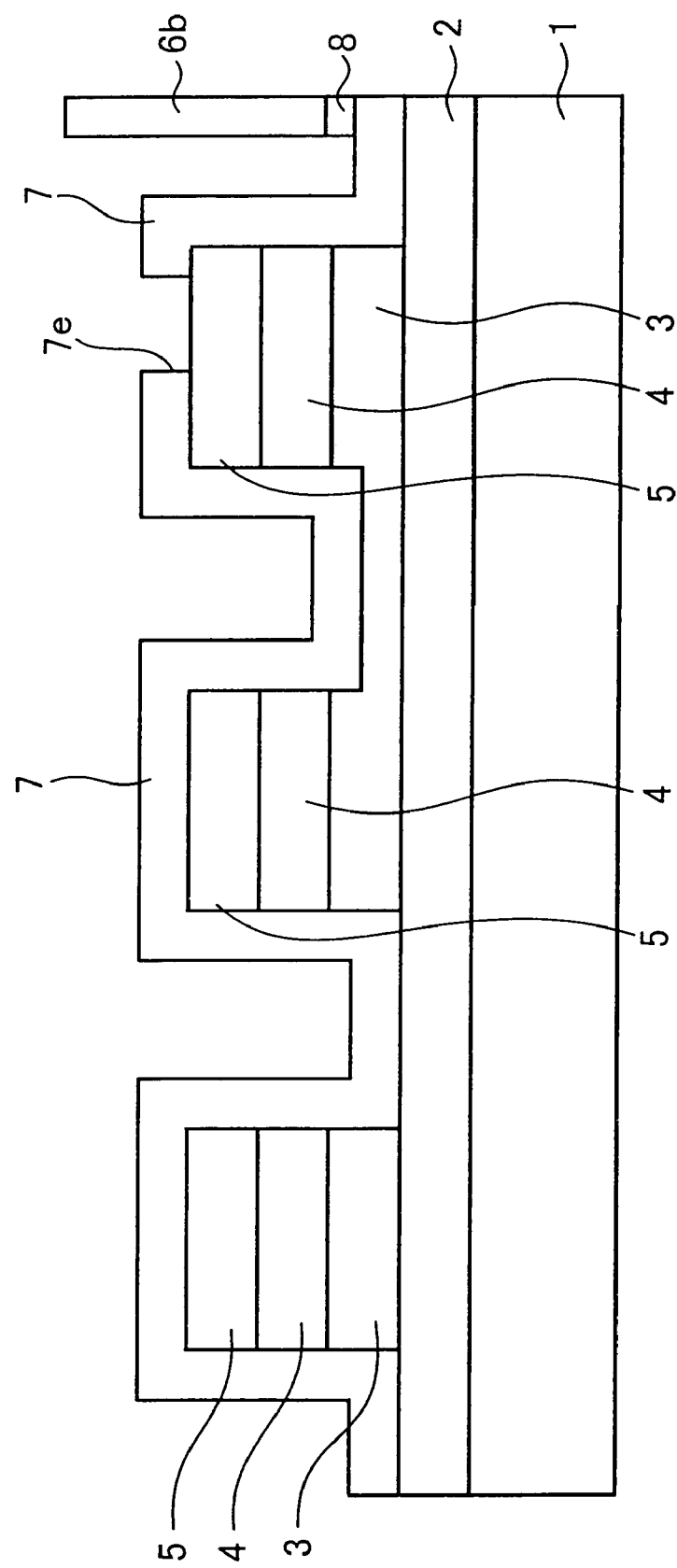
FIG. 36 is a cross-sectional view showing the feature of a transparent conductive film layer etching process.
Figure 37:
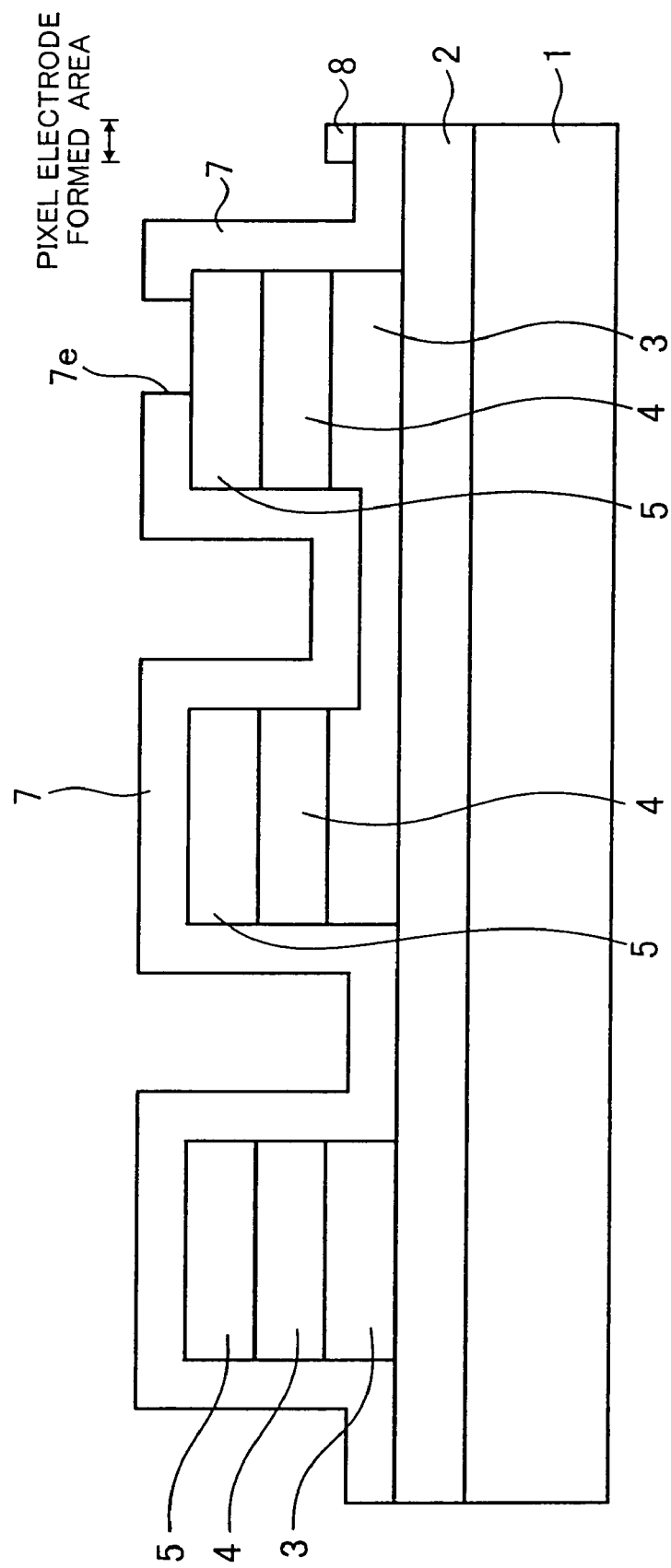
FIG. 37 is a cross-sectional view showing the feature of a resist stripping process performed after the transparent conductive film layer etching process.
Figure 38:
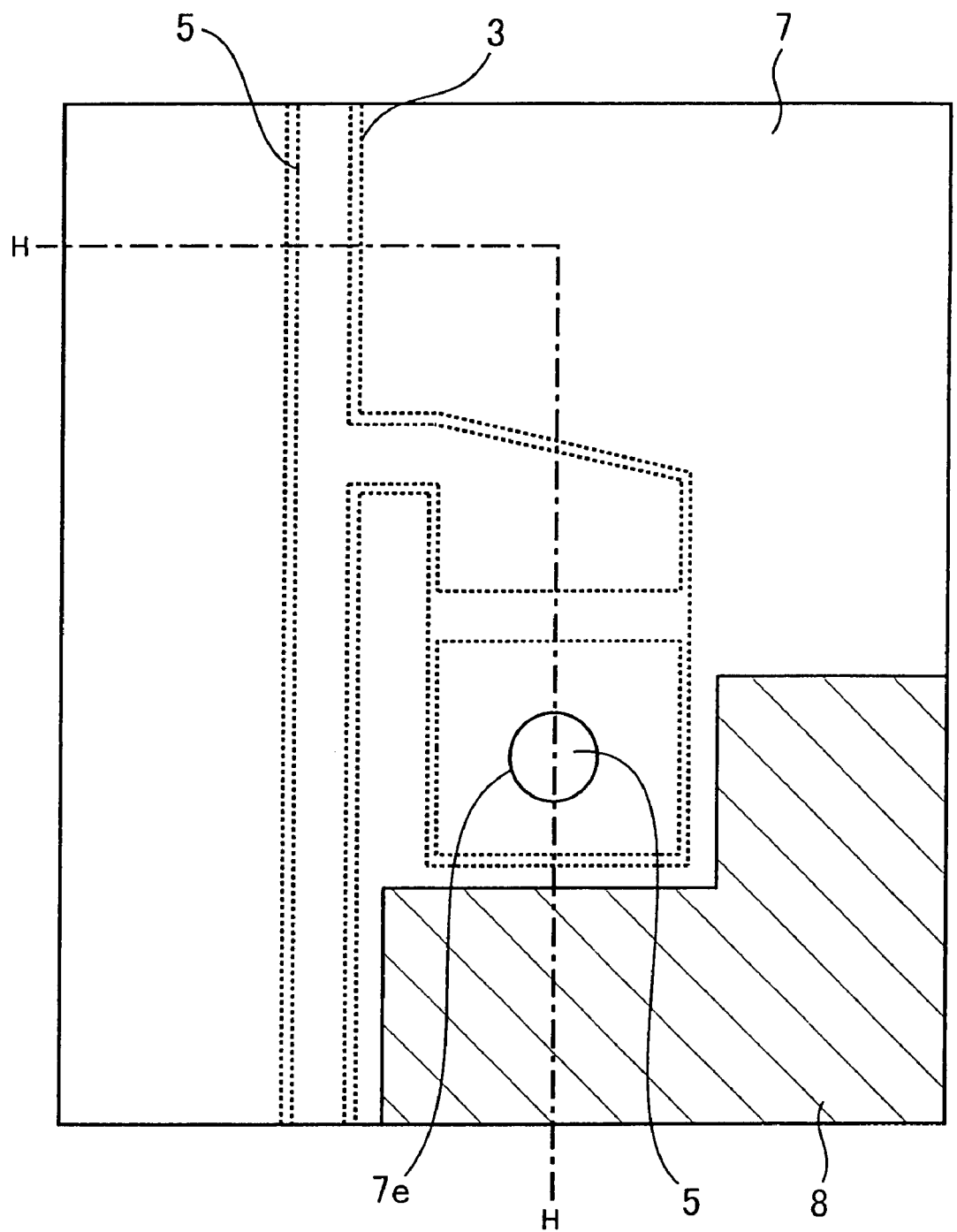
FIG. 38 is a plan view showing the feature of the basic structure of a TFT substrate in the resist stripping process performed after the transparent conductive film layer etching process.

FIG. 36 is a cross-sectional view showing the feature of a transparent conductive film layer etching process. FIG. 37 is a cross-sectional view showing the feature of a resist stripping process performed after the transparent conductive film layer etching process. FIG. 38 is a plan view showing the feature of the basic structure of a TFT substrate in the resist stripping process performed after the transparent conductive film layer etching process. FIG. 37 is a cross-sectional view taken along lines H-H of FIG. 38. For convenience, an operation layer 3 under a DB layer 5 is also shown in FIG. 38.

After the ashing of the photoresist 6b shown in FIG. 35 is performed, the transparent conductive film layer 8 is etched with the remaining resist pattern of the photoresist 6b as a mask, as shown in FIG. 36. Then the photoresist 6b is stripped. As a result, as shown in FIGS. 37 and 38, the basic structure of the TFT substrate in which the transparent conductive film layer 8 is formed in the pixel electrode formed area is formed. At this stage, however, the DB layer 5 is exposed in the contact hole 7e and is not yet in contact with the transparent conductive film layer 8.

Figure 39:
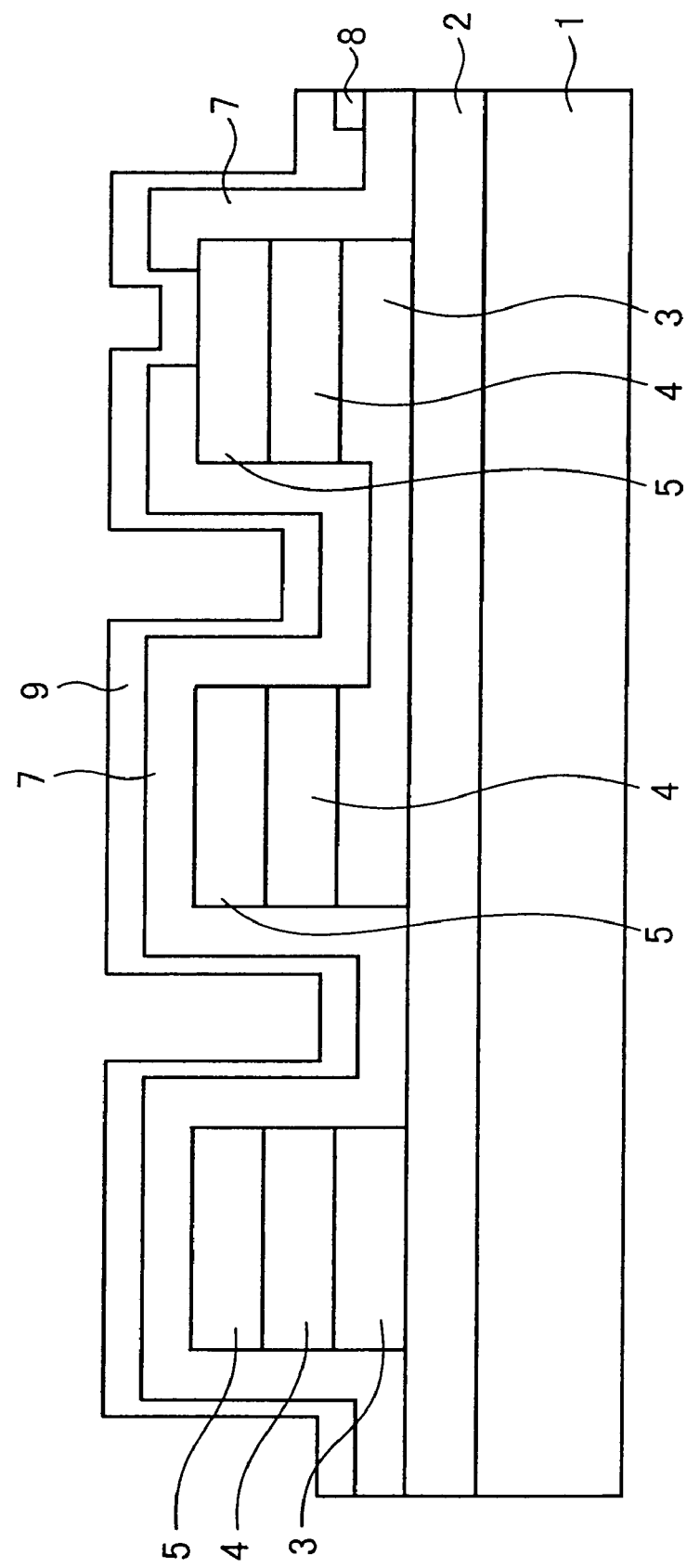
FIG. 39 is a cross-sectional view showing the feature of a GB layer formation process.
Figure 40:
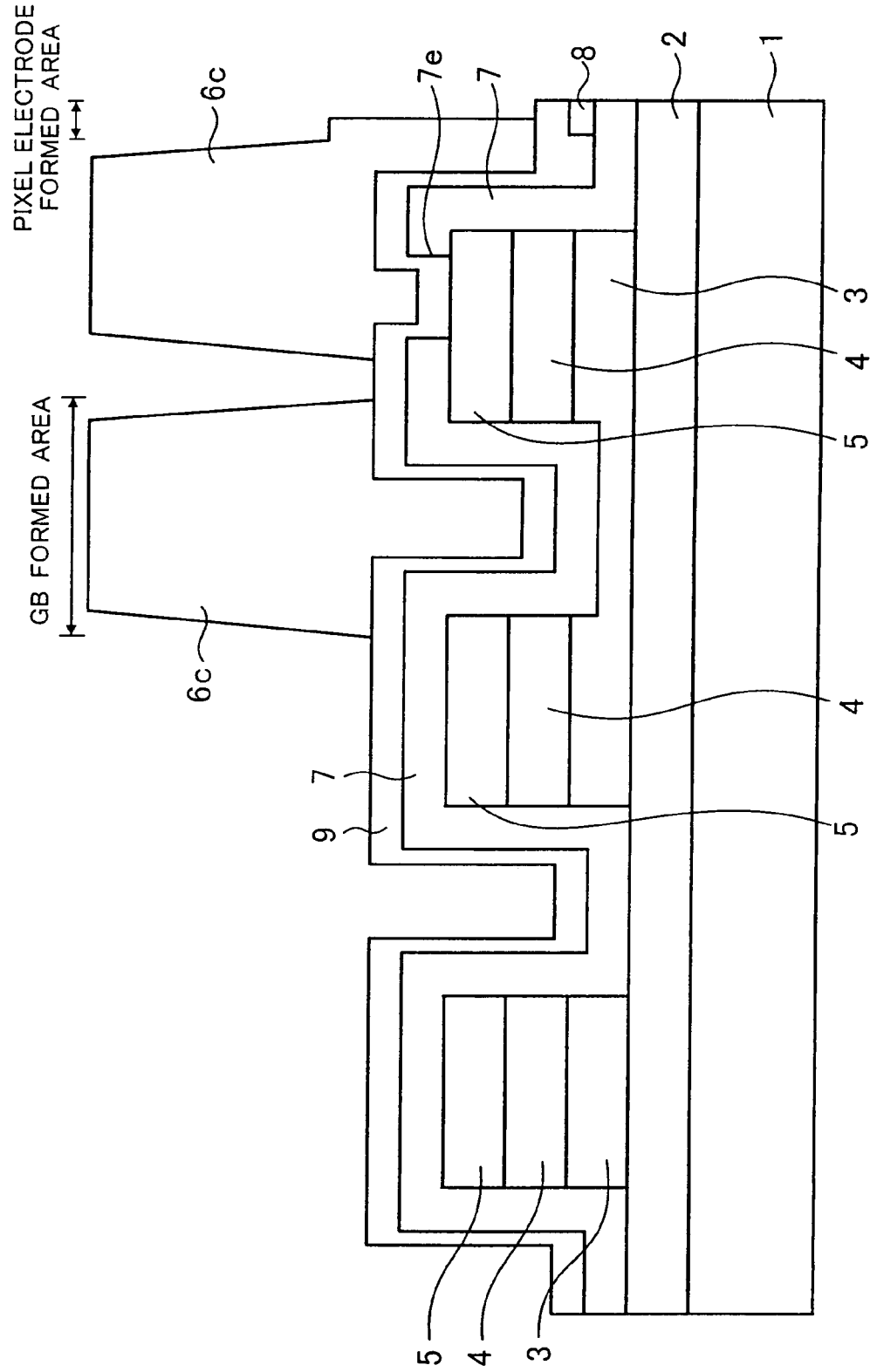
FIG. 40 is a cross-sectional view showing the feature of a third exposure process in a method for fabricating a stagger type TFT substrate according to a third embodiment of the present invention.
Figure 41:
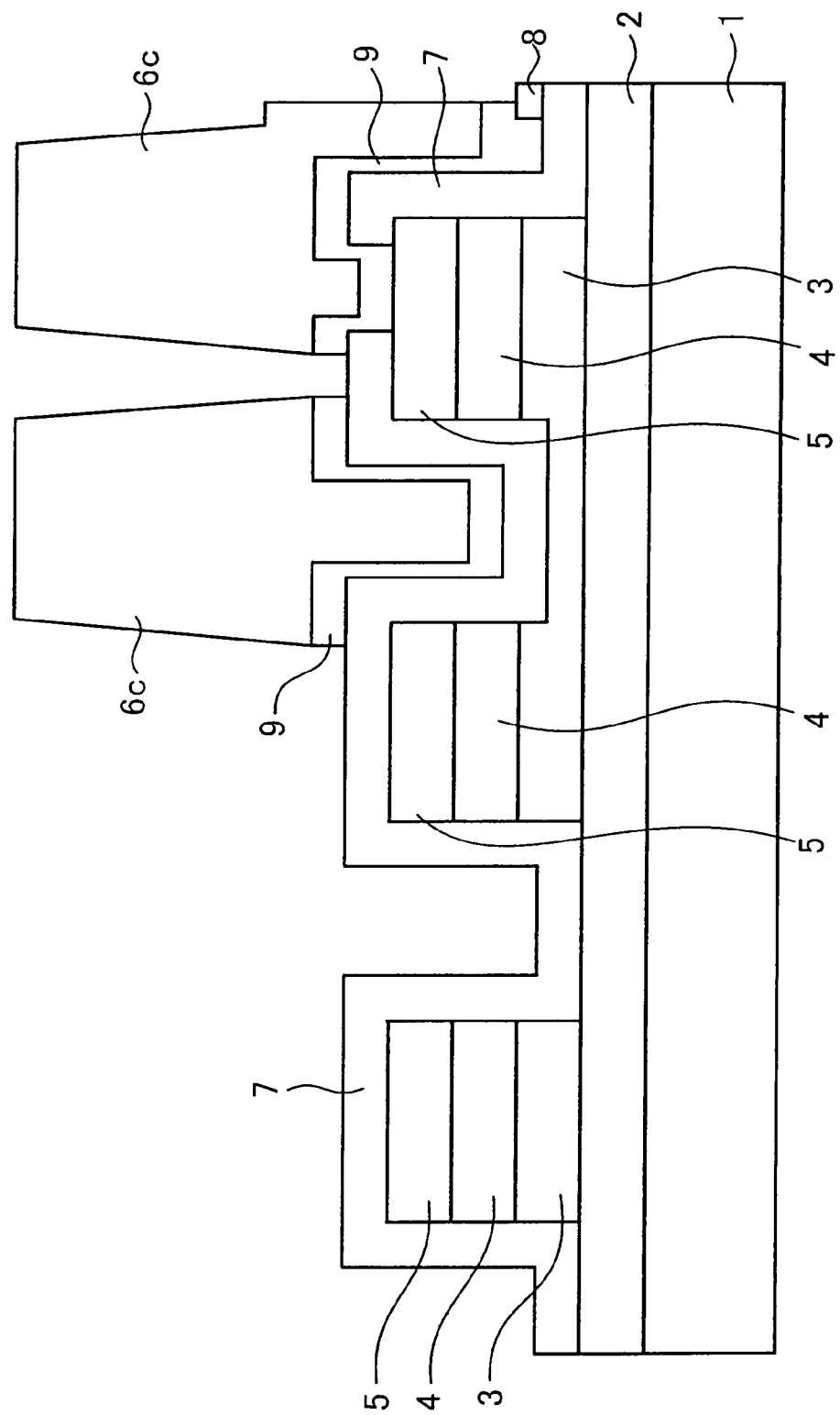
FIG. 41 is a cross-sectional view showing the feature of a GB layer and source pad formation process.
Figure 42:
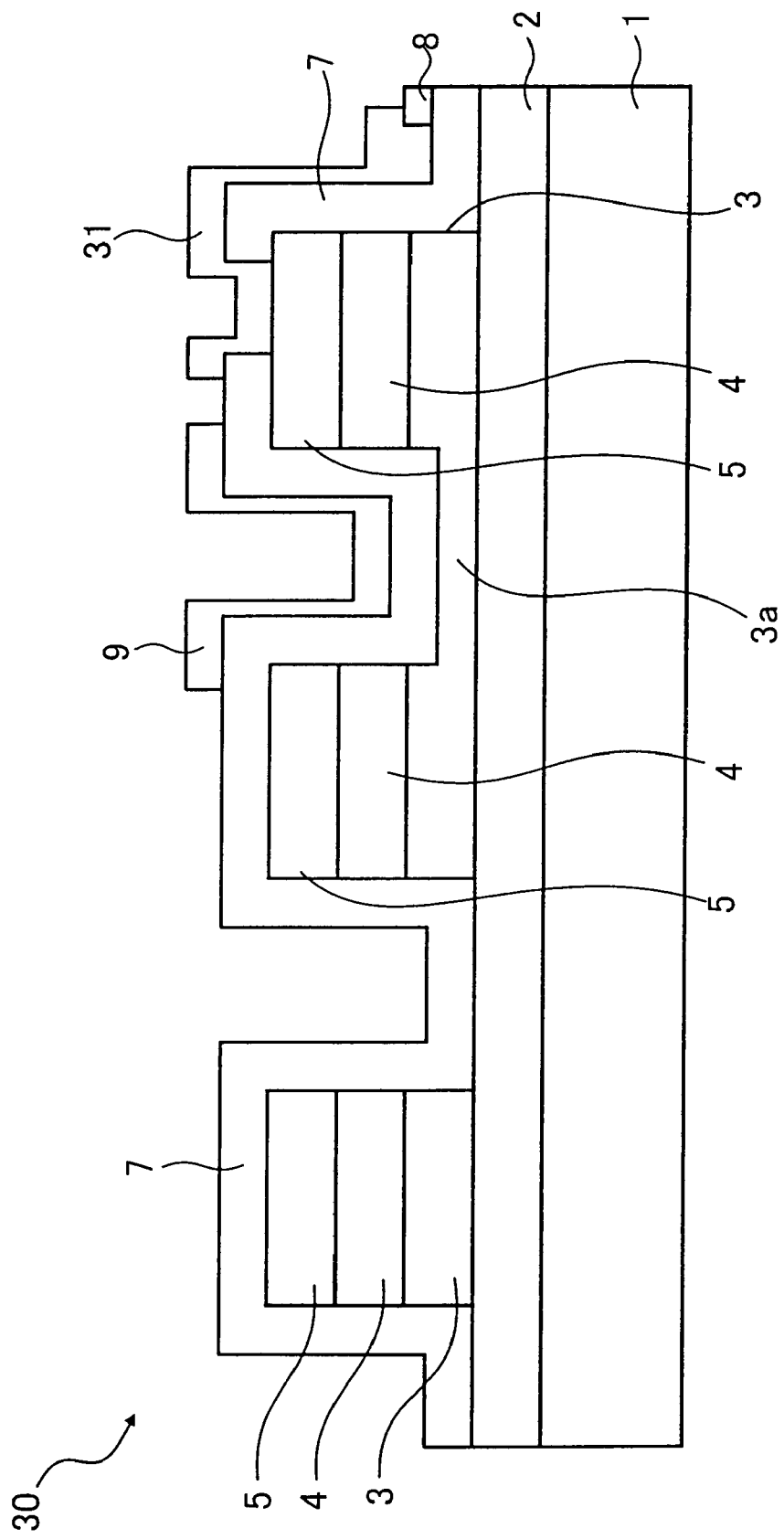
FIG. 42 is a cross-sectional view showing the feature of a resist stripping process performed after the GB layer and source pad formation process.
Figure 43:
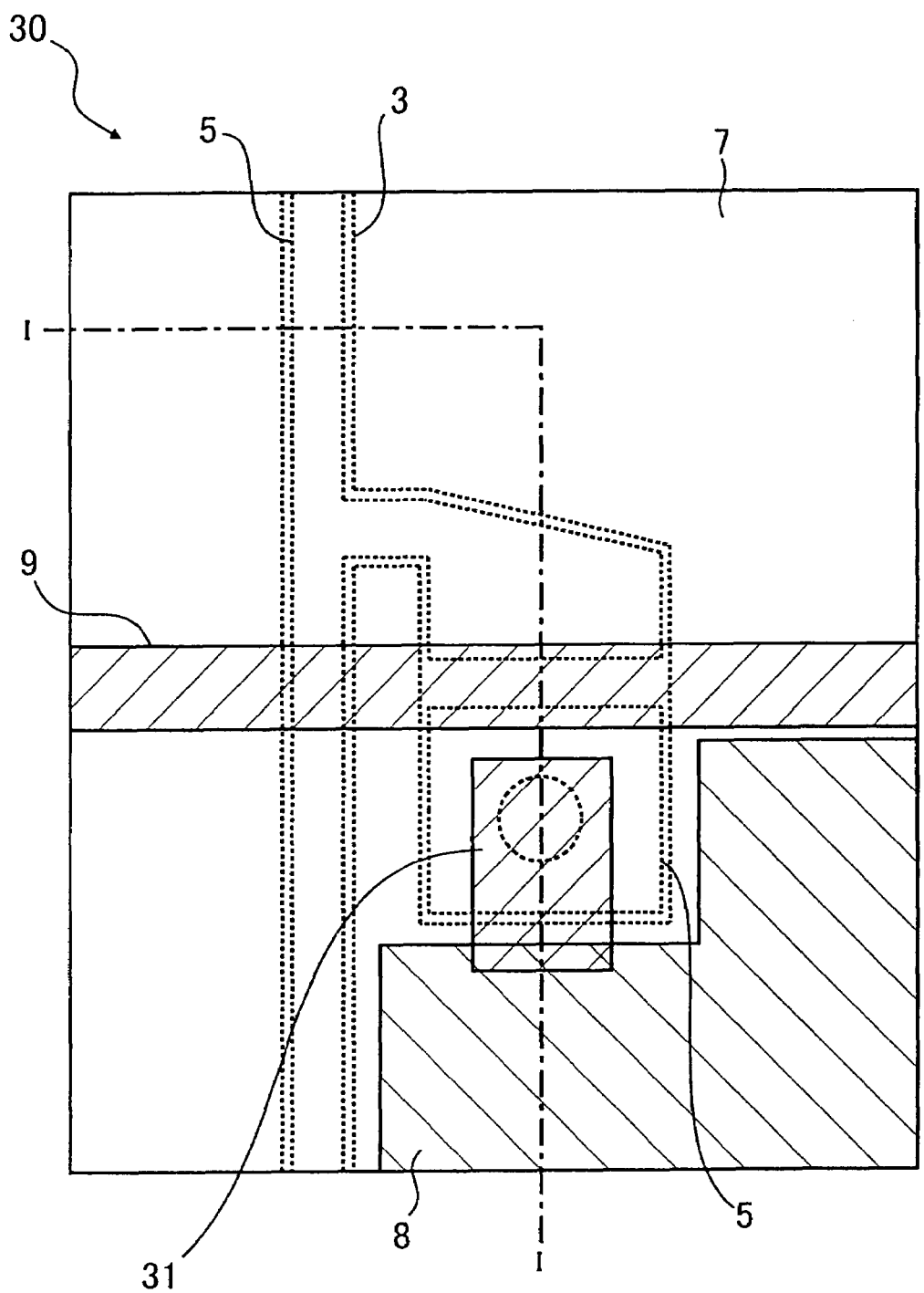
FIG. 43 is a plan view showing the feature of a TFT substrate according to the third embodiment of the present invention.

FIG. 39 is a cross-sectional view showing the feature of a GB layer formation process. FIG. 40 is a cross-sectional view showing the feature of a third exposure process in a method for fabricating a stagger type TFT substrate according to a third embodiment of the present invention. FIG. 41 is a cross-sectional view showing the feature of a GB layer and source pad formation process. FIG. 42 is a cross-sectional view showing the feature of a resist stripping process performed after the GB layer and source pad formation process. FIG. 43 is a plan view showing the feature of a TFT substrate according to the third embodiment of the present invention. FIG. 42 is a cross-sectional view taken along lines I-I of FIG. 43. For convenience, the operation layer 3 under the DB layer 5 is also shown in FIG. 43.

After the transparent conductive film layer 8 is formed in the pixel electrode formed area, a GB layer 9 is formed on the entire surface as shown in FIG. 39. As shown in FIG. 40, then a photoresist 6c is formed and a resist pattern which masks a GB formed area and an area extending from the pixel electrode formed area to the contact hole 7e is formed. As shown in FIG. 41, the GB layer 9 is etched with this resist pattern of the photoresist 6c as a mask. Then the photoresist 6c is stripped and a TFT substrate 30 shown in FIGS. 42 and 43 is formed. As a result, the GB layer 9 is formed on the insulating film 7 formed on a channel 3a as a gate electrode of a TFT and the GB layer 9 which connects the DB layer 5 and the transparent conductive film layer 8 is formed as a source pad 31.

As described above, in the method for fabricating a stagger type TFT substrate according to the third embodiment of the present invention, the first exposure process is the same as that performed in the first embodiment. In the second exposure process, the exposure is performed with the half tone mask to form the resist pattern in which the opening for forming the contact hole 7e is made and in which the photoresist in the pixel electrode formed area is thicker than the photoresist in the other areas. In the method for fabricating a stagger type TFT substrate according to the third embodiment of the present invention, the number of exposure processes necessary for fabricating a stagger type TFT substrate can be reduced by using a half tone mask in each of the first and second exposure processes. As a result, an improvement in productivity, an improvement in a yield, and a reduction in manufacturing costs can be realized.

In the method for fabricating a stagger type TFT substrate according to the third embodiment of the present invention, a half tone mask may be used only in one exposure process. This is the same with the first embodiment. Moreover, in the method for fabricating a stagger type TFT substrate according to the third embodiment of the present invention, the structure of terminals can be changed. This is the same with the first embodiment, too.

A fourth embodiment of the present invention will now be described.

In a method for fabricating a stagger type TFT substrate according to a fourth embodiment of the present invention, the same processes that are shown in FIGS. 2, 3, and 6 through 13 in the method for fabricating a stagger type TFT substrate according to the first embodiment of the present invention are performed. Processes performed after them will now be described with reference to FIGS. 44 through 48. Components in FIGS. 44 through 48 which are the same as those described in the first embodiment are designated by identical reference numerals and detailed descriptions of them will be omitted.

The TFT substrate according to the fourth embodiment of the present invention is a reflection type TFT substrate. In liquid crystal display units using such a TFT substrate, there is no need to irradiate it with light by, for example, a back light. An irregular layer for irregularly reflecting incident light is formed on the TFT side of the TFT substrate.

Figure 44:
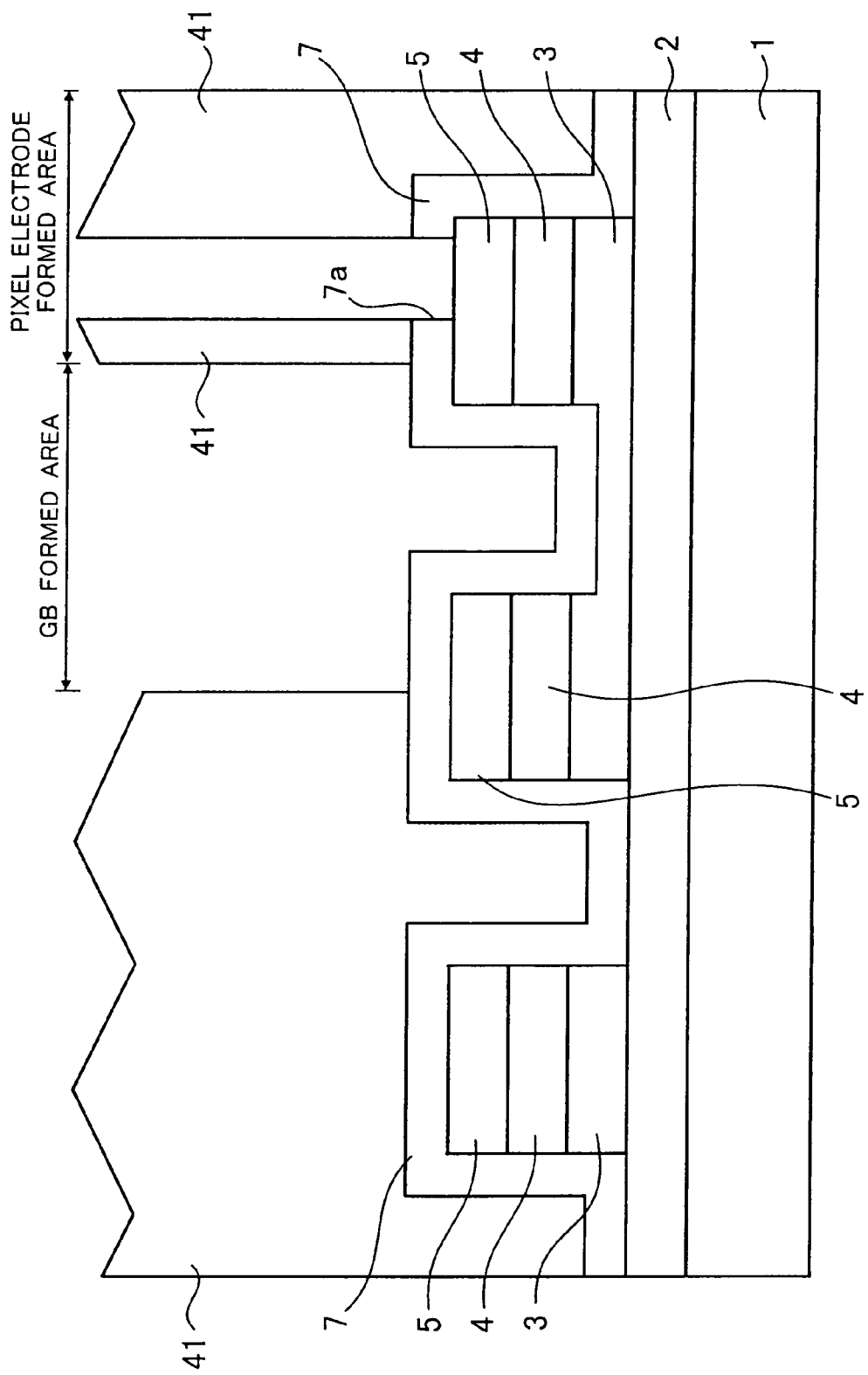
FIG. 44 is a cross-sectional view showing the feature of an irregular layer formation process.
Figure 45:
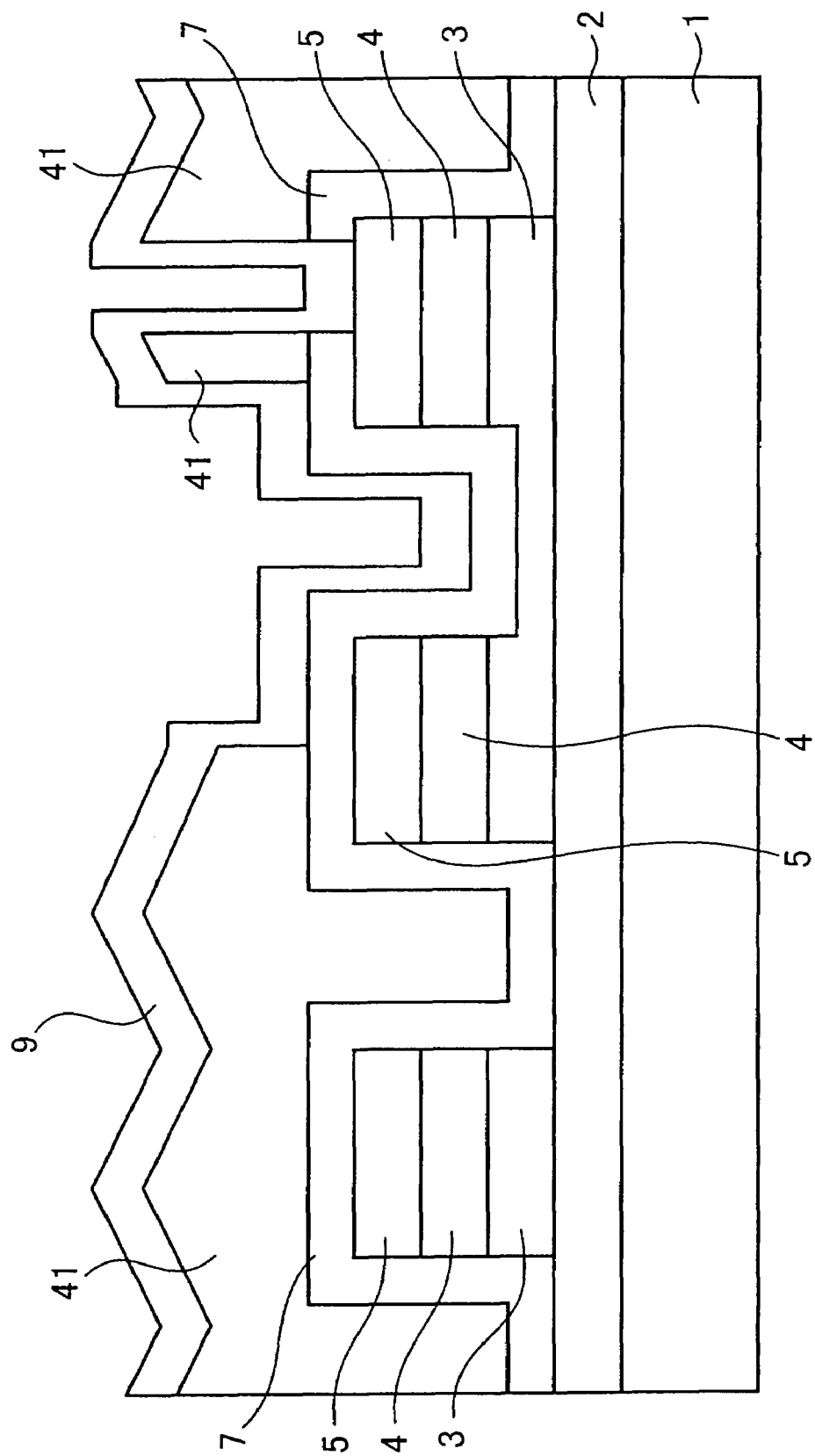
FIG. 45 is a cross-sectional view showing the feature of a GB layer formation process.
Figure 46:
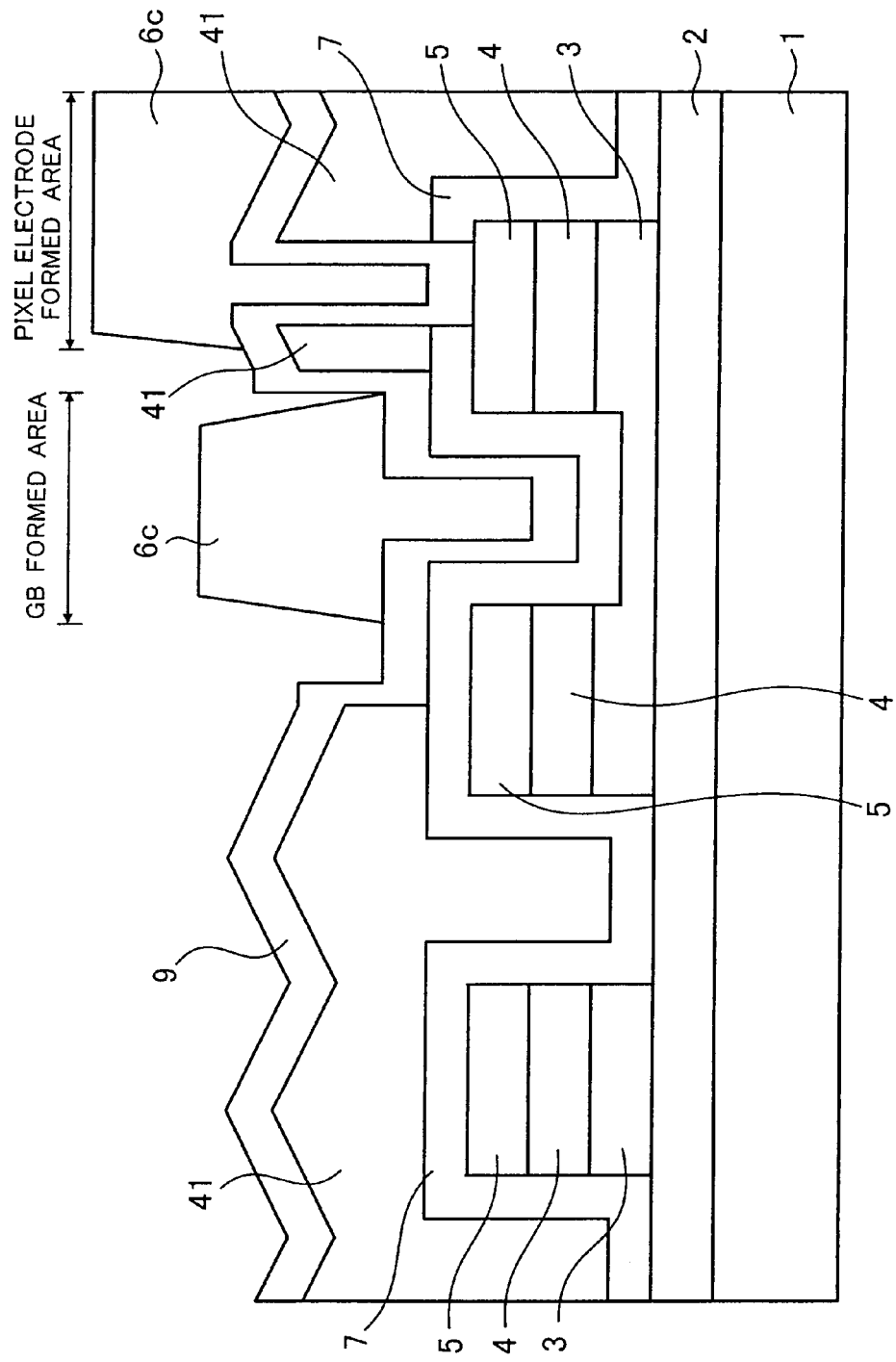
FIG. 46 is a cross-sectional view showing the feature of a third exposure process in a method for fabricating a stagger type TFT substrate according to a fourth embodiment of the present invention.

FIG. 44 is a cross-sectional view showing the feature of an irregular layer formation process. FIG. 45 is a cross-sectional view showing the feature of a GB layer formation process. FIG. 46 is a cross-sectional view showing the feature of a third exposure process in the method for fabricating a stagger type TFT substrate according to the fourth embodiment of the present invention.

After the insulating film etching process shown in FIG. 13 is performed, an irregular layer 41 the surface of which is irregular is formed on the entire surface except a GB formed area and an area where a contact hole 7a is made, as shown in FIG. 44. The irregular layer 41 can be formed by the use of a resin material, such as acrylic resin. As shown in FIG. 45, then a GB layer 9 is formed on the entire surface. As shown in FIG.

46, a photoresist 6c is formed and third exposure is performed to form a resist pattern which masks the GB formed area and a pixel electrode formed area.

Figure 47:
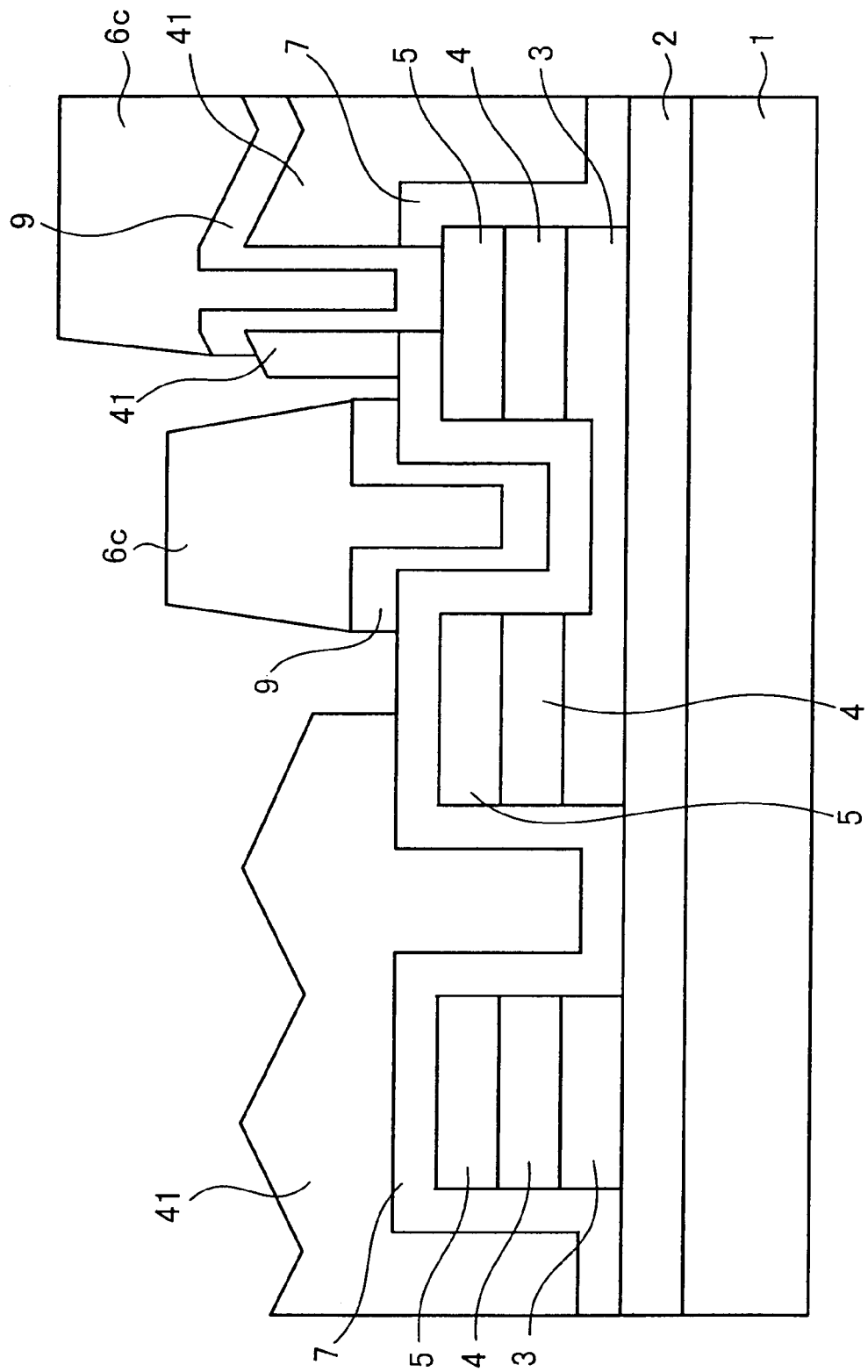
FIG. 47 is a cross-sectional view showing the feature of a GB layer etching process.
Figure 48:
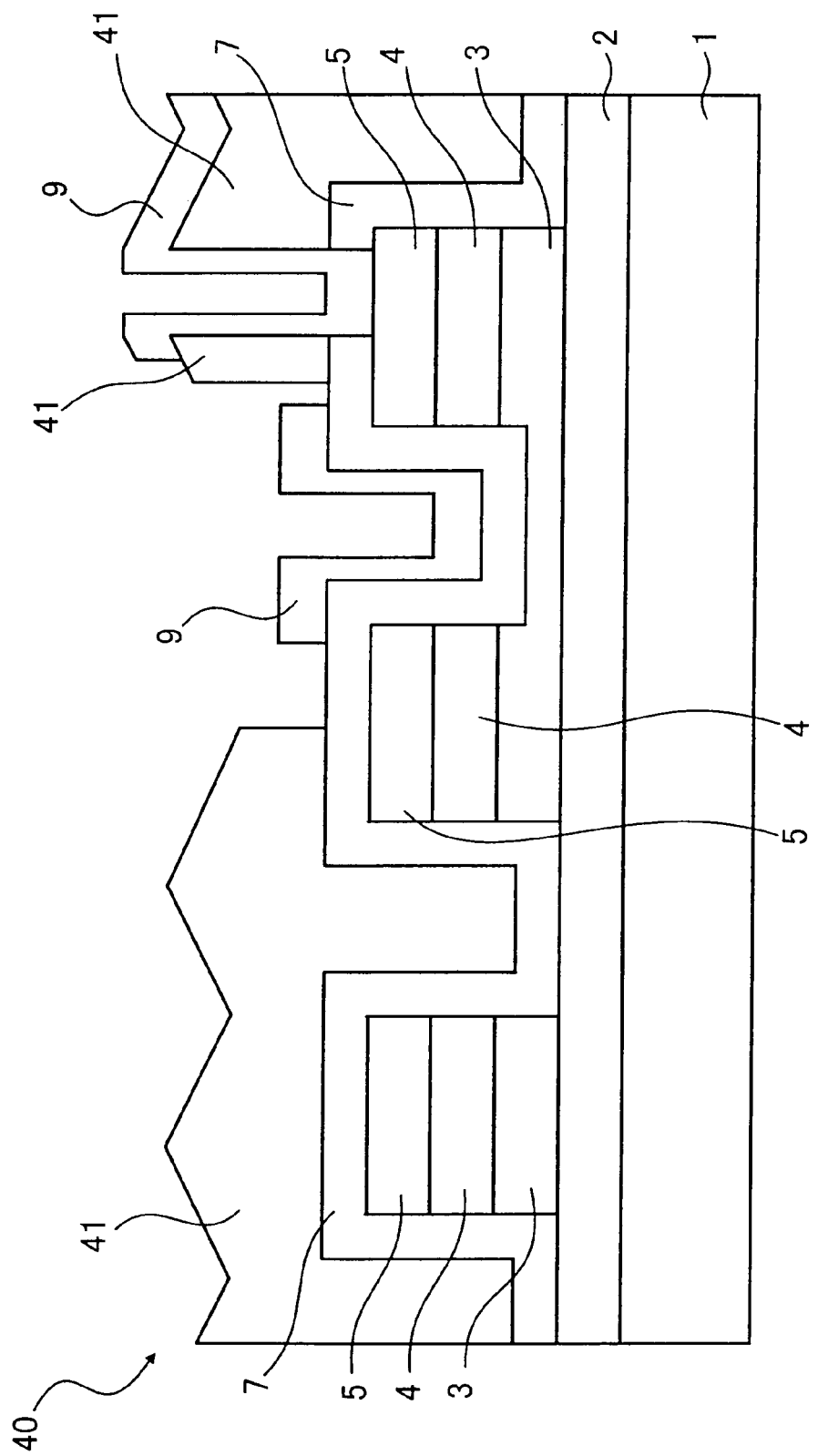
FIG. 48 is a cross-sectional view showing the feature of a resist stripping process performed after the GB layer etching process.

FIG. 47 is a cross-sectional view showing the feature of a GB layer etching process. FIG. 48 is a cross-sectional view showing the feature of a resist stripping process performed after the GB layer etching process.

After the resist pattern is formed, the GB layer 9 is etched with the photoresist 6c as a mask as shown in FIG. 47. As shown in FIG. 48, the photoresist 6c is stripped to form a reflection type TFT substrate 40. On the TFT substrate 40, the GB layer 9 is formed in the GB formed area as a gate electrode and is formed in pixel electrode formed area as a pixel electrode which also functions as a reflection film.

As described above, when the reflection type TFT substrate 40 is fabricated, the half tone mask is used once in the first exposure process. This reduces the number of exposure processes necessary for fabricating a stagger type TFT substrate. As a result, an improvement in productivity, an improvement in a yield, and a reduction in manufacturing costs can be realized.

In the method for fabricating a stagger type TFT substrate according to the fourth embodiment of the present invention, the structure of terminals can be changed. This is the same with the first embodiment.

Figure 49:
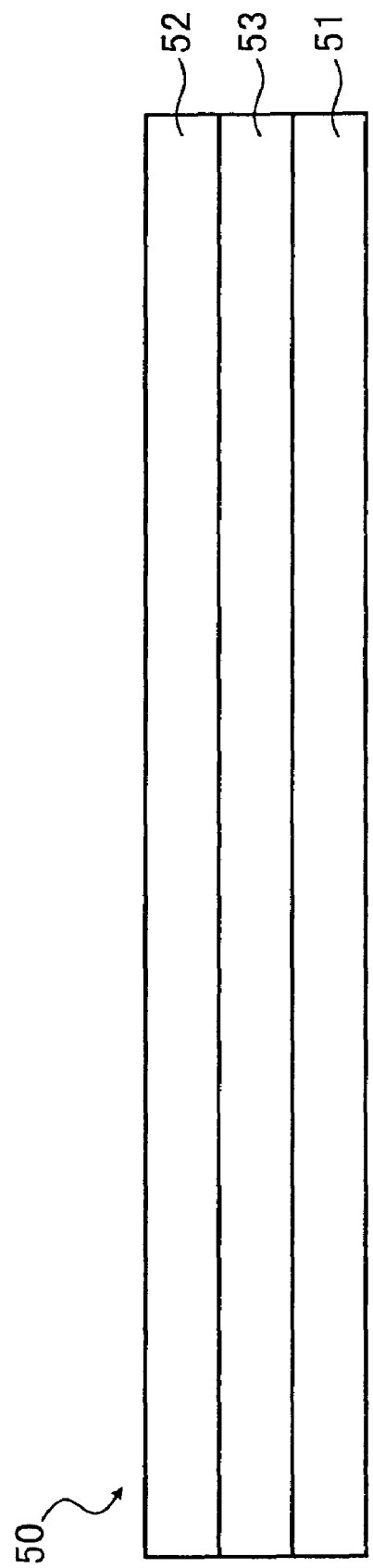
FIG. 49 is a cross-sectional view showing the feature of a liquid crystal display unit.

FIG. 49 is a cross-sectional view showing the feature of a liquid crystal display unit.

An orientational film is formed on the TFT side of a TFT substrate 51 obtained by the fabricating method according to any of the above first through fourth embodiments. A color filter (CF) substrate 52 on which a CF layer, a common electrode, and an orientational film are formed and the TFT substrate 51 are laminated together. Liquid crystal is sealed between the TFT substrate 51 and the CF substrate 52 laminated together to form a liquid crystal layer 53 between them. A polarizing film is stuck on the outer surface of each of the TFT substrate 51 and the CF substrate 52 to complete a liquid crystal display unit 50.

In the methods for fabricating the TFT substrate 51 according to the above first through fourth embodiments, the number of exposure processes is reduced. As a result, efficiency in the manufacture of the TFT substrates 51 is good. Therefore, the liquid crystal display units 50 having such a structure can be manufactured efficiently at a low cost.

As has been described in the foregoing, in the present invention the half tone masks which can form a resist pattern with different thicknesses in different areas by performing exposure once on a resist are used for fabricating a stagger type TFT substrate. As a result, the number of exposure processes necessary for fabricating the stagger type TFT substrate can be reduced and an improvement in productivity, an improvement in a yield, and a reduction in manufacturing costs can be realized. High-quality stagger type TFT substrates having no display defects can be manufactured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A stagger type thin film transistor substrate in which each of a source and a drain of a thin film transistor has a laminated structure including a silicon semiconductor layer, a silicon semiconductor layer containing impurities, and a metal layer formed in that order and in which a gate insulator of the thin film transistor is formed on the source and the drain, wherein a pixel electrode is connected to the source via a contact hole made in the gate insulator on the source, and wherein a gate electrode of the thin film transistor formed on the gate insulator has a laminated structure including two layers of different electrode materials and the pixel electrode connected to the source is made of an electrode material used in a lower layer of the gate electrode.

2. The stagger type thin film transistor substrate according to claim 1, wherein the lower layer of the gate electrode is a transparent conductive film.

* * * * *